(12) United States Patent
George et al.

(10) Patent No.: US 8,267,143 B2
(45) Date of Patent: Sep. 18, 2012

(54) APPARATUS FOR MECHANICALLY DEBONDING TEMPORARY BONDED SEMICONDUCTOR WAFERS

(75) Inventors: Gregory George, Colchester, VT (US); Hale Johnson, Jericho, VT (US); Patrick Gorun, Burlington, VT (US); James Hermanowski, Waterbury, VT (US); Matthew Stiles, Montpelier, VT (US)

(73) Assignee: Suss Microtec Lithography, GmbH, Garching (DE)

( * ) Notice: Subject to any disclaimer, the term of this patent is extended or adjusted under 35 U.S.C. 154(b) by 295 days.

(21) Appl. No.: 12/761,014

(22) Filed: Apr. 15, 2010

(65) Prior Publication Data

US 2010/0263794 A1  Oct. 21, 2010

Related U.S. Application Data

(60) Provisional application No. 61/169,753, filed on Apr. 16, 2009.

(51) Int. Cl.
*B32B 38/10* (2006.01)

(52) U.S. Cl. ........ 156/758; 156/707; 156/714; 156/764; 156/930; 156/941

(58) Field of Classification Search ................. 156/556, 156/707, 714, 758, 764, 930, 941; 438/458
See application file for complete search history.

(56) References Cited

U.S. PATENT DOCUMENTS

| | | | | |
|---|---|---|---|---|
| 4,046,985 A | * | 9/1977 | Gates ..................... | 219/121.82 |
| 5,863,375 A | * | 1/1999 | Cha et al. .................. | 156/701 |
| 6,140,209 A | * | 10/2000 | Iwane et al. ................ | 438/458 |
| 6,221,740 B1 | * | 4/2001 | Bryan et al. ................ | 438/458 |
| 6,792,991 B2 | | 9/2004 | Thallner | |
| 6,971,428 B2 | * | 12/2005 | Eichlseder ................ | 156/382 |

(Continued)

FOREIGN PATENT DOCUMENTS

DE  102006031434 A1  1/2008

(Continued)

OTHER PUBLICATIONS

Kharas, Dave and Nagul Sooriar, Cycle Time and Cost Reduction Benefits of an Automated Bonder and Debonder System for a High vol. 150 mm GaAs HBT Back-end Process Floe, CS MANTECH Conference, May 18-21, 2009, Tampa, Forida, USA.

(Continued)

*Primary Examiner* — Mark A Osele
(74) *Attorney, Agent, or Firm* — Aliki K. Collins; AKC Patents LLC

(57) ABSTRACT

An apparatus for debonding two temporary bonded wafers includes a chuck assembly, a flex plate assembly and a contact roller. The chuck assembly includes a chuck and a first wafer holder to hold wafers in contact with the top surface of the chuck. The flex plate assembly includes a flex plate and a second wafer holder configured to hold wafers in contact with a first surface of the flex plate. The flex plate comprises a first edge arranged adjacent to a first edge of the chuck and connected to a hinge. The flex plate is configured to swing around the hinge and to be placed above the top surface of the chuck. The contact roller is arranged adjacent to a second edge of the chuck, which is diametrically opposite to its first edge. A debond drive motor moves the contact roller vertical to the plane of the chuck top surface.

11 Claims, 40 Drawing Sheets

U.S. PATENT DOCUMENTS

| | | |
|---|---|---|
| 7,367,773 B2 | 5/2008 | Buitron et al. |
| 2003/0089455 A1* | 5/2003 | Sakaguchi et al. ............ 156/344 |
| 2003/0170424 A1 | 9/2003 | Roberds et al. |
| 2004/0166653 A1* | 8/2004 | Kerdiles et al. ............... 438/458 |
| 2005/0150597 A1* | 7/2005 | Henley et al. ................. 156/344 |
| 2006/0264004 A1 | 11/2006 | Tong et al. |
| 2006/0289992 A1 | 12/2006 | Wood |
| 2008/0008565 A1 | 1/2008 | Thallner |
| 2008/0200011 A1 | 8/2008 | Pillalamarri et al. |
| 2008/0271845 A1 | 11/2008 | Keite-Telgenbuscher et al. |
| 2008/0302481 A1 | 12/2008 | Berger et al. |
| 2009/0038750 A1 | 2/2009 | Hong et al. |
| 2009/0165277 A1 | 7/2009 | Zussy et al. |
| 2009/0218560 A1 | 9/2009 | Flaim et al. |
| 2009/0258583 A1 | 10/2009 | Thallner |

FOREIGN PATENT DOCUMENTS

| | | |
|---|---|---|
| JP | 2003197724 A | 7/2003 |
| KR | 1020050004904 A | 1/2005 |
| KR | 1020050033440 A | 4/2005 |
| KR | 1020060028439 A | 3/2006 |
| KR | 1020060031701 A | 4/2006 |
| WO | WO2008045669 A1 | 4/2008 |
| WO | WO2009094558 A2 | 7/2009 |

OTHER PUBLICATIONS

Privett, Mark and Franz Murauer, Jurgen Burggraf, Stefan Pergfrieder, Chad Brubaker, TSV Thinned Wafer Debonding Process Optimization, Undated.

EV Group Temporary Bonding/Debonding Systems EVG 850TB/DB, http://www.evgroup.com/documents/brochures/evg850_tb_db_shortbrochure.pdf.

* cited by examiner

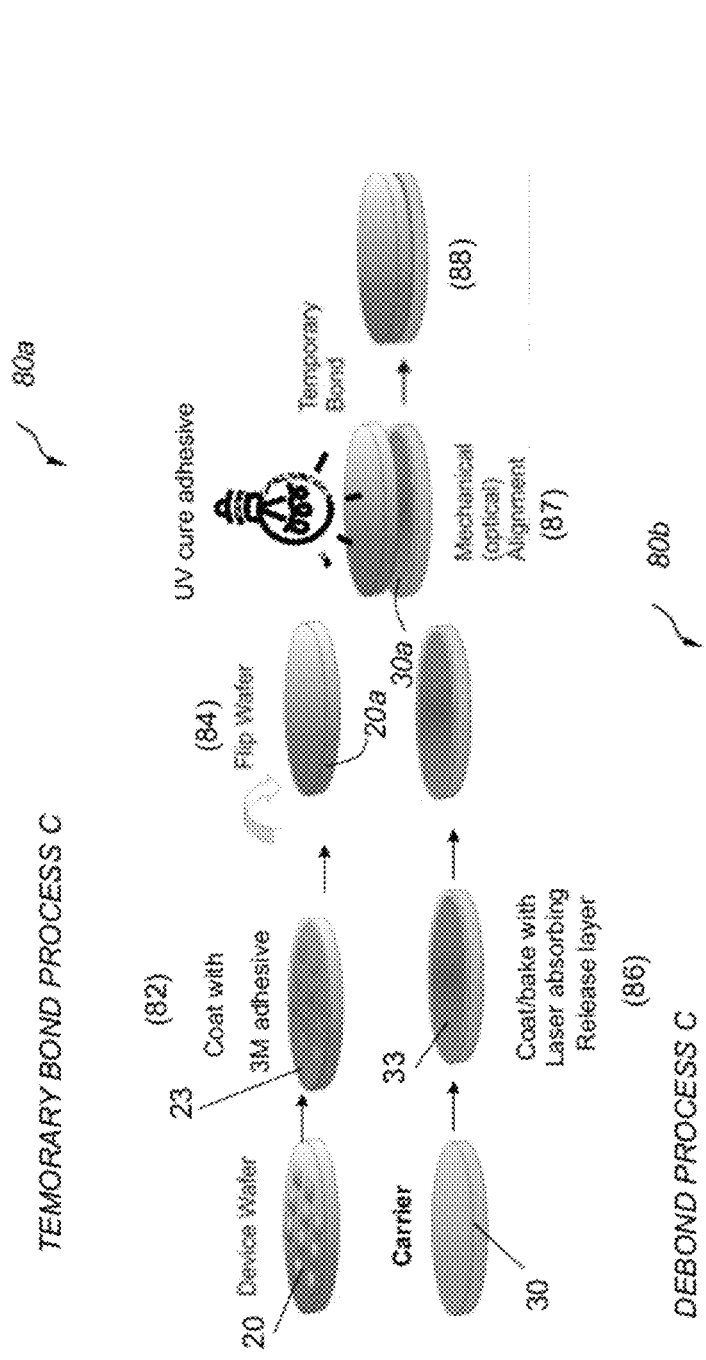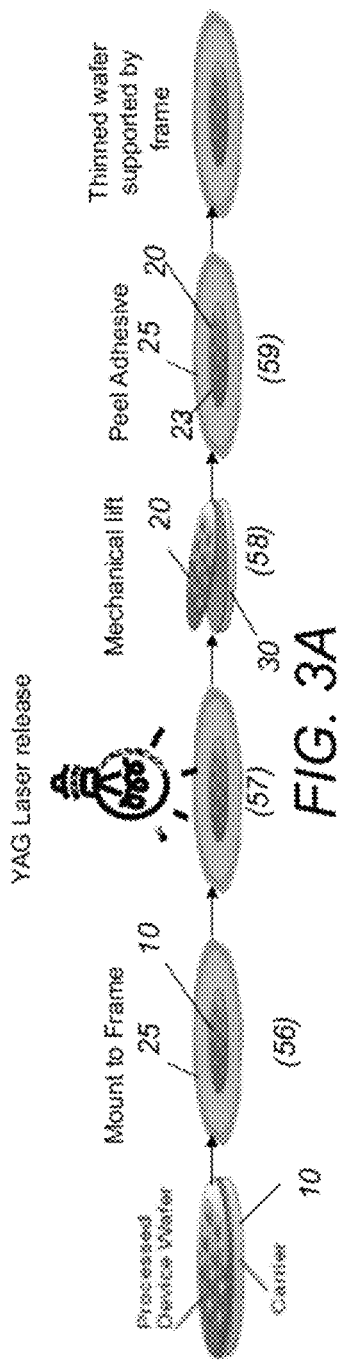
FIG. 3A

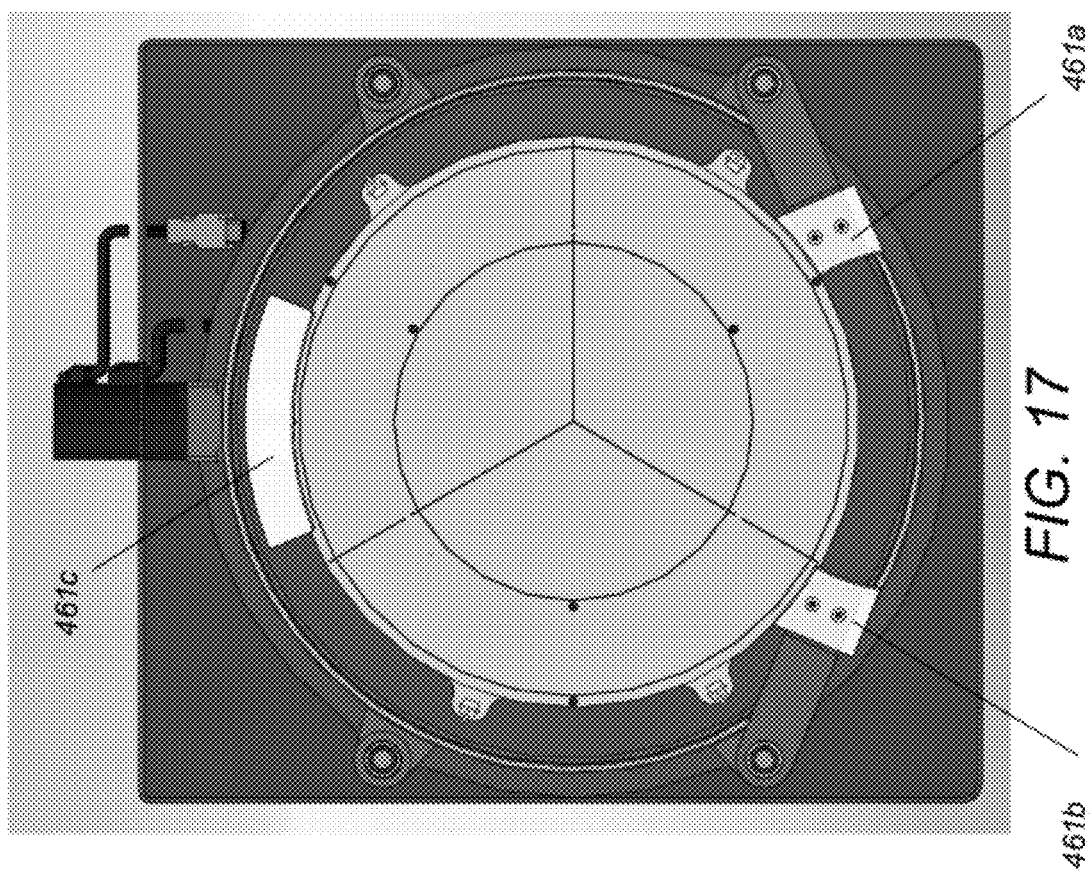

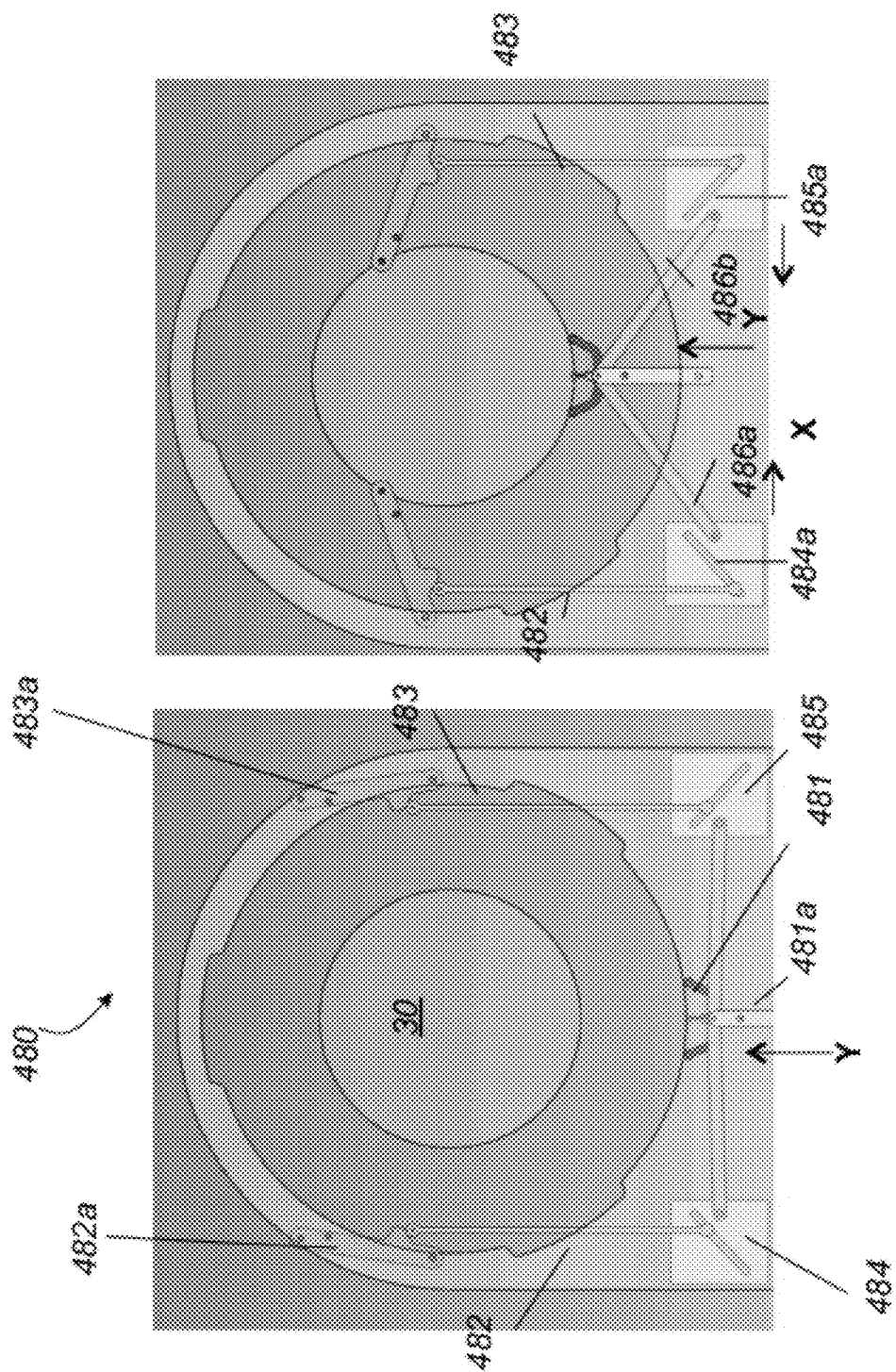

APPARATUS FOR MECHANICALLY DEBONDING TEMPORARY BONDED SEMICONDUCTOR WAFERS

CROSS REFERENCE TO RELATED CO-PENDING APPLICATIONS

This application claims the benefit of U.S. provisional application Ser. No. 61/169,753 filed Apr. 16, 2009 and entitled "IMPROVED APPARATUS FOR TEMPORARY WAFER BONDING", the contents of which are expressly incorporated herein by reference.

FIELD OF THE INVENTION

The present invention relates to an apparatus for mechanically debonding temporary bonded semiconductor wafers, and more particularly to an industrial-scale mechanical debonder for debonding semiconductor wafers bonded via an adhesive layer combined with a release layer.

BACKGROUND OF THE INVENTION

Several semiconductor wafer processes include wafer thinning steps. In some applications the wafers are thinned down to a thickness of less than 100 micrometers for the fabrication of integrated circuit (IC) devices. Thin wafers have the advantages of improved heat removal and better electrical operation of the fabricated IC devices. In one example, GaAs wafers are thinned down to 25 micrometers to fabricate power CMOS devices with improved heat removal. Wafer thinning also contributes to a reduction of the device capacitance and to an increase of its impedance, both of which result in an overall size reduction of the fabricated device. In other applications, wafer thinning is used for 3D-Integration bonding and for fabricating through wafer vias.

Wafer thinning is usually performed via back-grinding and/or chemical mechanical polishing (CMP). CMP involves bringing the wafer surface into contact with a hard and flat rotating horizontal platter in the presence of a liquid slurry. The slurry usually contains abrasive powders, such as diamond or silicon carbide, along with chemical etchants such as ammonia, fluoride, or combinations thereof. The abrasives cause substrate thinning, while the etchants polish the substrate surface at the submicron level. The wafer is maintained in contact with the abrasives until a certain amount of substrate has been removed in order to achieve a targeted thickness.

For wafer thicknesses of over 200 micrometers, the wafer is usually held in place with a fixture that utilizes a vacuum chuck or some other means of mechanical attachment. However, for wafer thicknesses of less than 200 micrometer and especially for wafers of less than 100 micrometers, it becomes increasingly difficult to mechanically hold the wafers and to maintain control of the planarity and integrity of the wafers during thinning. In these cases, it is actually common for wafers to develop microfractures and to break during CMP.

An alternative to mechanical holding of the wafers during thinning involves attaching a first surface of the device wafer (i.e., wafer processed into a device) onto a carrier wafer and thinning down the exposed opposite device wafer surface. The bond between the carrier wafer and the device wafer is temporary and is removed upon completion of the thinning and any other processing steps.

Several temporary bonding techniques have been suggested including using of adhesive compounds or using of adhesive tapes or layers. Thinned device wafers are debonded from the carrier wafers after processing by chemically dissolving the adhesive layer or by applying heat or radiation in order to decompose the adhesive layer or tape. Extreme care is needed during the debonding process in order to avoid fracture, surface damage, or warping of the extremely thin wafers, typically having a thickness of about 2-80 micrometers. It is desirable to provide an industrial-scale apparatus for debonding adhesively bonded semiconductor wafers that protects extremely thinned wafers from fracture, surface damage or warping.

SUMMARY OF THE INVENTION

In general, in one aspect, the invention features a debonder apparatus for debonding two via an adhesive layer combined with a release layer temporary bonded wafers including a chuck assembly, a flex plate assembly and a contact roller. The chuck assembly includes a chuck and a first wafer holder configured to hold wafers in contact with the top surface of the chuck. The flex plate assembly includes a flex plate and a second wafer holder configured to hold wafers in contact with a first surface of the flex plate. The flex plate comprises a first edge connected to a hinge and a second edge diametrically opposite to the first edge, and the flex plate's first edge is arranged adjacent to a first edge of the chuck and the flex plate is configured to swing around the hinge and to be placed above the top surface of the chuck. The contact roller is arranged adjacent to a second edge of the chuck, the second edge of the chuck being diametrically opposite to its first edge. A debond drive motor is configured to move the contact roller vertical to the plane of the chuck top surface. In operation, a wafer pair, comprising a carrier wafer stacked upon and being bonded to a device wafer via an adhesive layer and a release layer, is placed upon the chuck so that the unbonded surface of the device wafer is in contact with the chuck top surface. Next, the flex plate swings around the hinge and is placed above the bottom chuck so that its first surface is in contact with the unbonded surface of the carrier wafer. Next, the contact roller is driven upward until it contacts and pushes the second edge of the flex plate up while the carrier wafer is held by the flex plate and the device wafer is held by the chuck via the second and first wafer holders, respectively. The contact roller push flexes the second edge of the flex plate and causes delamination of the wafer pair along the release layer.

Implementations of this aspect of the invention may include one or more of the following features. The debonder may further include a hinge motor that drives the hinge. The first and second holders comprise vacuum pulling through the chuck and the flex plate, respectively. The wafer pair further includes a tape frame and the device wafer is held by the chuck by holding the tape frame via the vacuum pulled through the chuck. The debonder further includes a support plate supporting the chuck assembly, the flex plate assembly and the hinge. The debonder further includes a base plate supporting the support plate, the contact roller, the hinge motor and the debond drive motor. The flex plate assembly further includes a lift pin assembly designed to raise and lower wafers placed on the first surface of the flex plate. The flex plate further includes two independently controlled concentric vacuum zones configured to hold wafers having a diameter of 200 or 300 millimeters, respectively. The vacuum zones are sealed via one of an O-ring or suction cups. The chuck comprises a vacuum chuck made of porous ceramic materials. The debonder further includes an anti-backlash gear drive configured to prevent accidental back swing of the flex plate.

In general, in another aspect, the invention features a method for debonding two via an adhesive layer combined with a release layer temporary bonded wafers. The method includes the following steps. First, providing a debond apparatus comprising a chuck assembly, a flex plate assembly and a contact roller. The chuck assembly comprises a chuck and a first wafer holder configured to hold wafers in contact with the top surface of the chuck. The flex plate assembly comprises a flex plate and a second wafer holder configured to hold wafers in contact with a first surface of the flex plate. The flex plate comprises a first edge connected to a hinge and a second edge diametrically opposite to the first edge, and the flex plate's first edge is arranged adjacent to a first edge of the chuck and the flex plate is configured to swing around the hinge and to be placed above the top surface of the chuck. The contact roller is arranged adjacent to a second edge of the chuck, the second edge of the chuck being diametrically opposite to its first edge. Next, providing a wafer pair comprising a carrier wafer stacked upon and being bonded to a device wafer via an adhesive layer and a release layer. Next, placing the wafer pair upon the chuck so that the unbonded surface of the device wafer is in contact with the chuck top surface. Next, swinging the flex plate around the hinge and placing it above the bottom chuck so that its first surface is in contact with the unbonded surface of the carrier wafer. Next, driving the contact roller upward until it contacts and pushes the second edge of the flex plate up while the carrier wafer is held by the flex plate and the device wafer is held by the chuck via the second and first wafer holders, respectively. Finally, the contact roller push flexes the second edge of the flex plate and causes delamination of the wafer pair along the release layer.

The details of one or more embodiments of the invention are set forth in the accompanying drawings and description below. Other features, objects and advantages of the invention will be apparent from the following description of the preferred embodiments, the drawings and from the claims.

BRIEF DESCRIPTION OF THE DRAWINGS

Referring to the figures, wherein like numerals represent like parts throughout the several views:

FIG. 3A is a schematic diagram of temporary wafer bonding process C and debonding process C performed in bonder module C and debonder C of FIG. 1, respectively;

FIG. 17 depicts wafer centering device of FIG. 16 with the pre-alignment arms in the closed position;

FIG. 19C depicts another wafer centering device for the pre-alignment of a wafer with the rotating arms in the open position;

FIG. 19D depicts the wafer centering device of FIG. 19C with the rotating arms in the closed position;

DETAILED DESCRIPTION OF THE INVENTION

Figure 1:
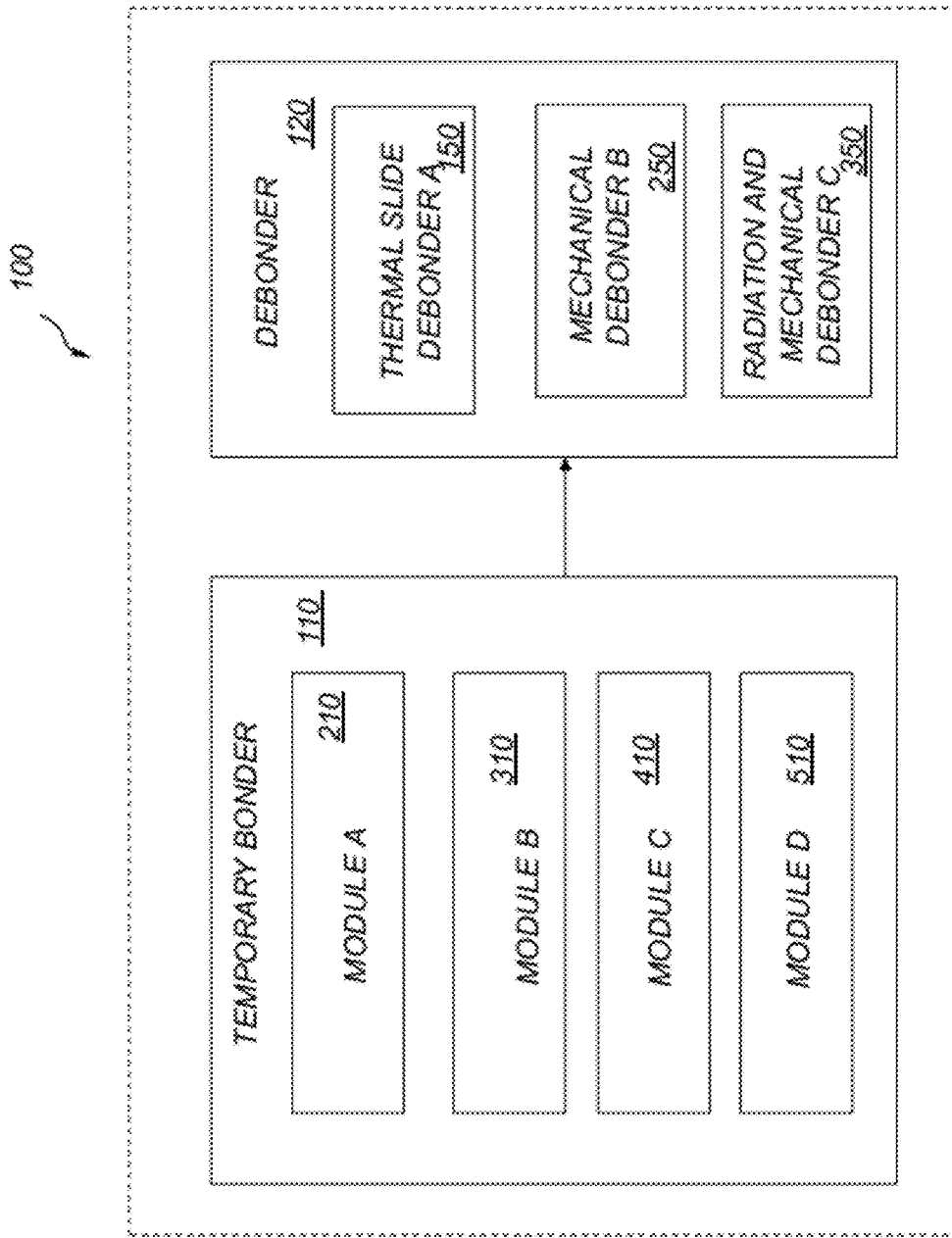
FIG. 1 is an overview schematic diagram of the improved temporary wafer bonder and debonder system according to this invention.

Referring to FIG. 1, an improved apparatus for temporary wafer bonding and debonding 100 includes a temporary bonder cluster 110 and a debonder cluster 120. The temporary bonder cluster 110 includes temporary bonder module A, module B, module C, and module D, 210, 310, 410 and 510 respectively. Debonder cluster 120 includes a thermal slide debonder A 150, a mechanical debonder B 250 and a radiation/mechanical debonder C 350. Bonder cluster 110 facilitates the temporary bonding processes A, B, C, and D, 60*a*, 70*a*, 80*a* and 90*a*, shown in FIG. 1A, FIG. 2A, FIG. 3A, and FIG. 4, respectively, among others. Debonder cluster 120 facilitates the debonding processes A, B and C, 60*b*, 70*b*, and 80*b*, shown in FIG. 1A, FIG. 2A and FIG. 3A, respectively.

Figure 1A:
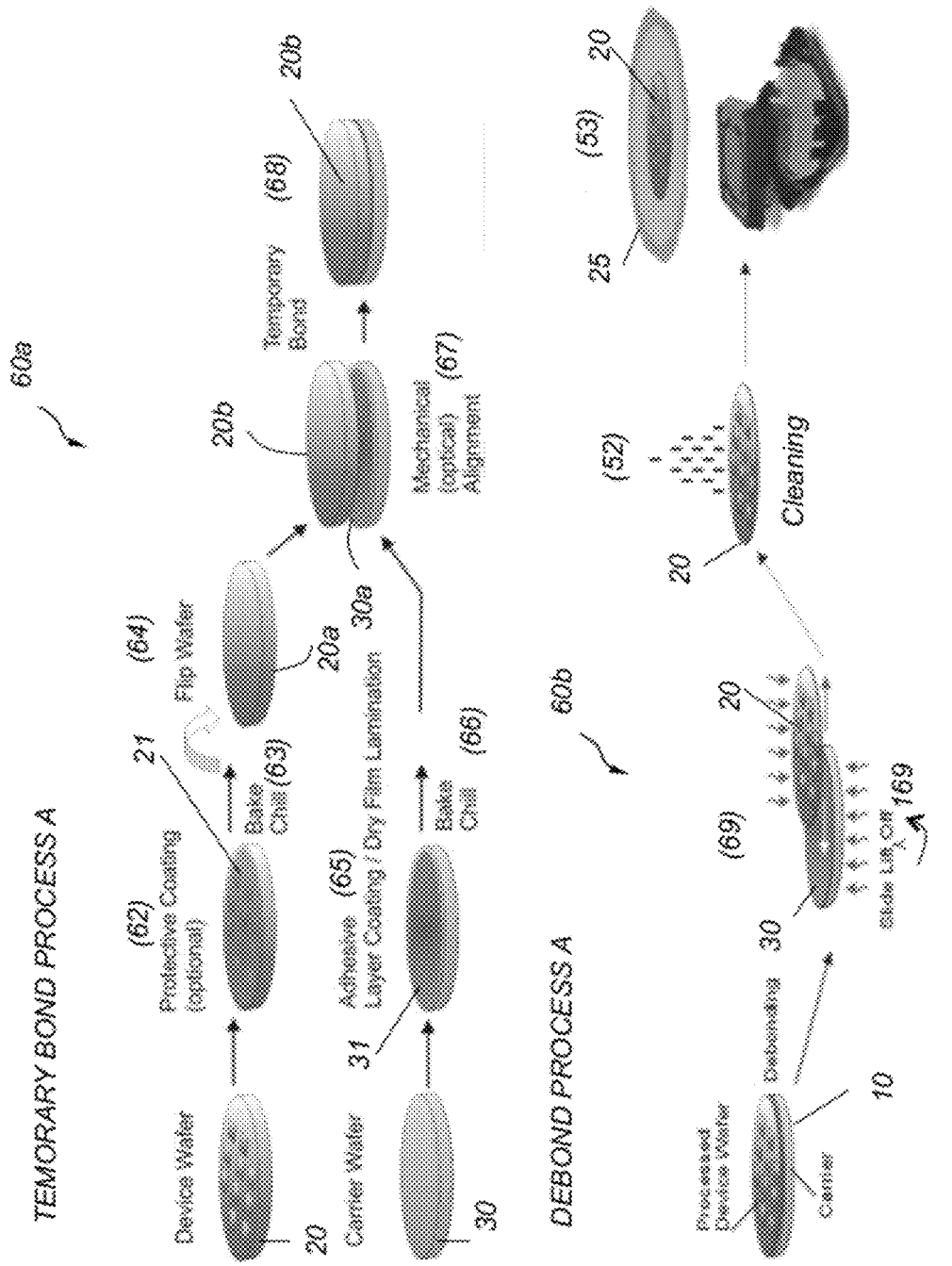
FIG. 1A is a schematic diagram of temporary wafer bonding process A and debonding process A performed in bonder module A and debonder A of FIG. 1, respectively.

Referring to FIG. 1A, temporary bond process A 60*a* includes the following steps. First, device wafer 20 is coated with a protective coating 21 (62), the coating is then baked and chilled (63) and then the wafer is flipped (64). A carrier wafer 30 is coated with an adhesive layer 31 (65) and then the coating is baked and chilled (66). In other embodiments, a dry adhesive film is laminated onto the carrier wafer, instead of coating an adhesive layer. Next, the flipped device wafer 20 is aligned with the carrier wafer 30 so that the surface of the device wafer with the protective coating 20*a* is opposite to the surface of the carrier wafer with the adhesive layer 30*a* (67) and then the two wafers are bonded (68) in temporary bonder module A, shown in FIG. 1B. The bond is a temporary bond between the protective layer 21 and the adhesive layer 31. In other embodiments, no protective coating is applied onto the device wafer surface and the device wafer surface 20*a* is directly bonded with the adhesive layer 31. Examples of device wafers include GaAs wafers, silicon wafers, or any other semiconductor wafer that needs to be thinned down to less than 100 micrometers. These thin wafers are used in military and telecommunication applications for the fabrication of power amplifiers or other power devices where good heat removal and small power factor are desirable. The carrier wafer is usually made of a non-contaminating material that is thermally matched with the device wafer, i.e., has the same coefficient of thermal expansion (CTE). Examples of carrier wafer materials include silicon, glass, sapphire, quartz or other semiconductor materials. The diameter of the carrier wafer is usually the same as or slightly larger than the diameter of the device wafer, in order to support the device wafer edge and prevent cracking or chipping of the device wafer edge. In one example, the carrier wafer thickness is about 1000 micrometers and the total thickness variation (TTV) is 2-3 micrometers. Carrier wafers are recycled and reused after they are debonded from the device wafer. In one example, adhesive layer 31 is an organic adhesive WaferBOND™ HT-10.10, manufactured by Brewer Science, Missouri, USA. Adhesive 31 is applied via a spin-on process and has a thickness in the range of 9 to 25 micrometers. The spin speed is in the rage of 1000 to 2500 rpm and the spin time is between 3-60 second. After the spin-on application, the adhesive layer is baked for 2 min at a temperature between 100° C. to 150° C. and then cured for 1-3 minutes at a temperature between 160° C. to 220° C. WaferBOND™ HT-10.10 layer is optically transparent and is stable up to 220° C. After the thinning of the exposed device wafer surface 20*b* the carrier wafer 30 is debonded via the debond process A 60*b*, shown in FIG. 1A. Debond process A 60*b*, includes the following steps. First heating the wafer stack 10 until the adhesive layer 31 softens and the carrier wafer 30 slides off from the thinned wafer (69). The WaferBOND™ HT-10.10 debonding time is less than 5 minutes. The thinned wafer 20 is then cleaned, any adhesive residue is stripped away (52) and the thinned wafer is placed in a dicing frame 25 (53) In some embodiments, a small rotational motion (twisting) of the carrier wafer takes place prior to the sliding translational motion.

Figure 1B:
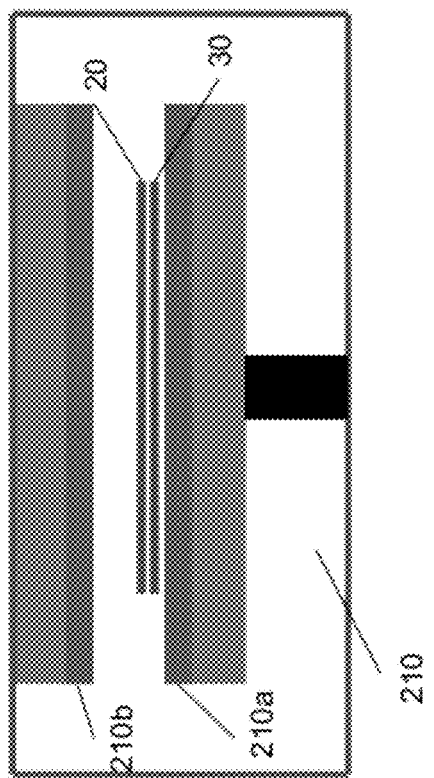
FIG. 1B depicts a schematic cross-sectional view of the bonder module A of FIG. 1 and a list of the process steps for performing the temporary wafer bonding process A of FIG. 1A.

The temporary bonding (68) of the carrier wafer 30 to the device wafer 20 takes place in temporary bonder module A, 210. Referring to FIG. 1B, the device wafer 20 is placed in the fixture chuck 202 and the fixture chuck is loaded in the chamber 210. The carrier wafer 30 is placed with the adhesive layer facing up directly on the bottom chuck 210*a* and the two wafers 20, 30 are stacked and aligned. The top chuck 210*b* is lowered down onto the stacked wafers and a low force is applied. The chamber is evacuated and the temperature is raised to 200° C. for the formation of the bond between the protective coating layer 21 and the adhesive layer 31. Next, the chamber is cooled and the fixture is unloaded.

The debond process A 60*b* is a thermal slide debond process and includes the following steps, shown in FIG. 1A. The bonded wafer stack 10 is heated causing the adhesive layer 31 to become soft. The carrier wafer is then twisted around axis 169 and then slid off the wafer stack under controlled applied force and velocity (69). The separated device wafer 20 is then cleaned (52) and mounted onto a dicing frame 25 (53).

Figure 2A:
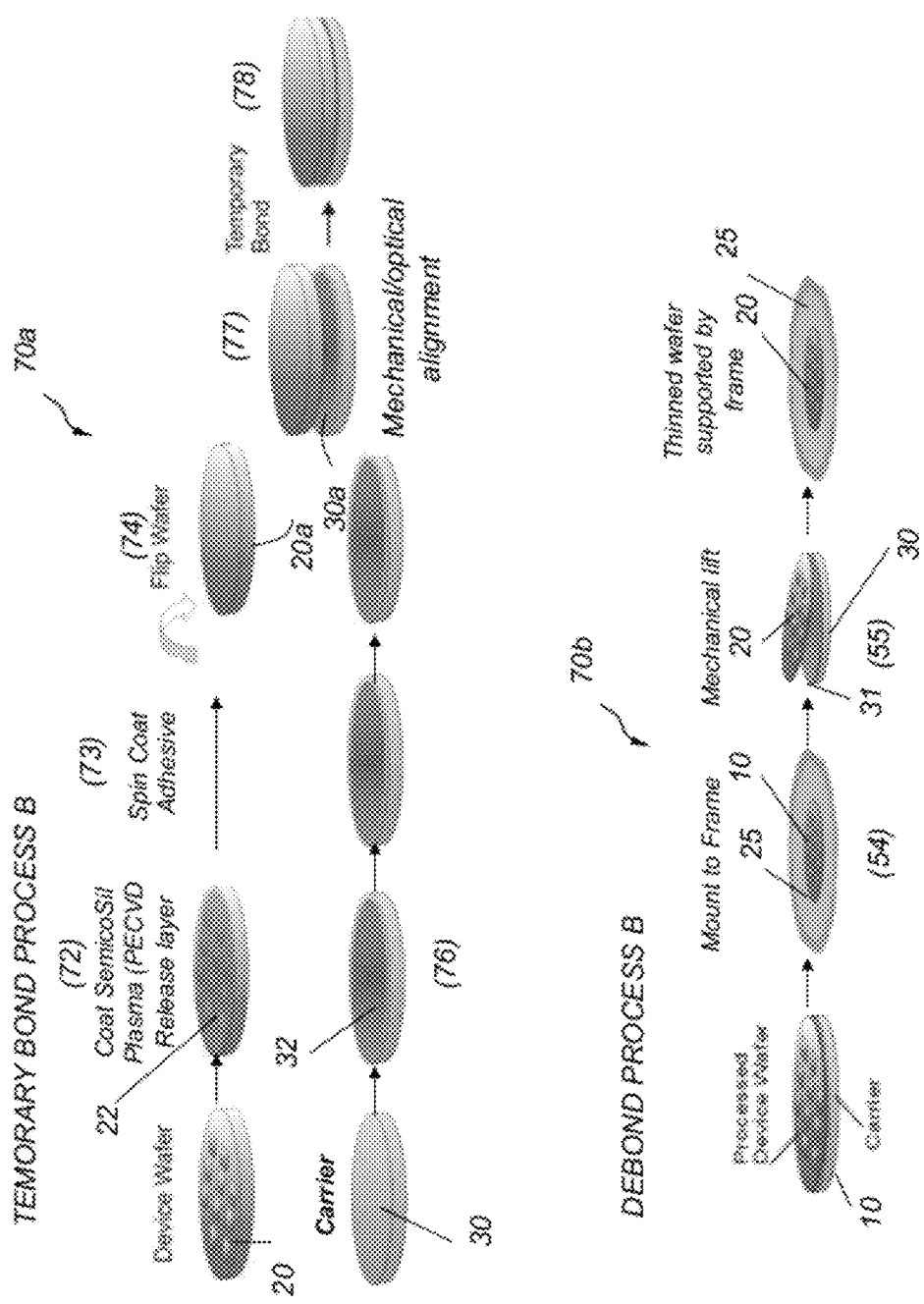
FIG. 2A is a schematic diagram of temporary wafer bonding process B and debonding process B performed in bonder module B and debonder B of FIG. 1, respectively.

Referring to FIG. 2A, temporary bond process B 70*a* includes the following steps. First, a release layer 22 is formed onto a surface 20*a* of the device wafer 20 (72). The release layer is formed by first spin-coating a precursor compound onto the wafer device surface 20*a* and then performing Plasma Enhanced Chemical Vapor deposition (PECVD) in a commercially available PECVD chamber. In one example, the precursor for the release layer is SemicoSil™, a silicon rubber manufactured by Wacker, Germany. The coated device wafer is then spin coated with an adhesive (73) and then flipped (74). Next, a soft layer 32 is spin coated on a surface 30*a* of the carrier wafer 30 (76). In one example, soft layer 32 is a hot temperature cross-linking (HTC) silicone elastomer. Next, the flipped device wafer 20 is aligned with the carrier wafer 30 so that the surface 20*a* of the device wafer with the release layer 22 is opposite to the surface 30*a* of the carrier wafer with the soft layer 32 (77) and then the two wafers are bonded (78) in the temporary bonder module B, shown in FIG. 2B. The temporary bond is formed under vacuum of 0.1 mbar, curing temperature between 150° C. to 200° C. and low applied bond force.

Figure 2B:
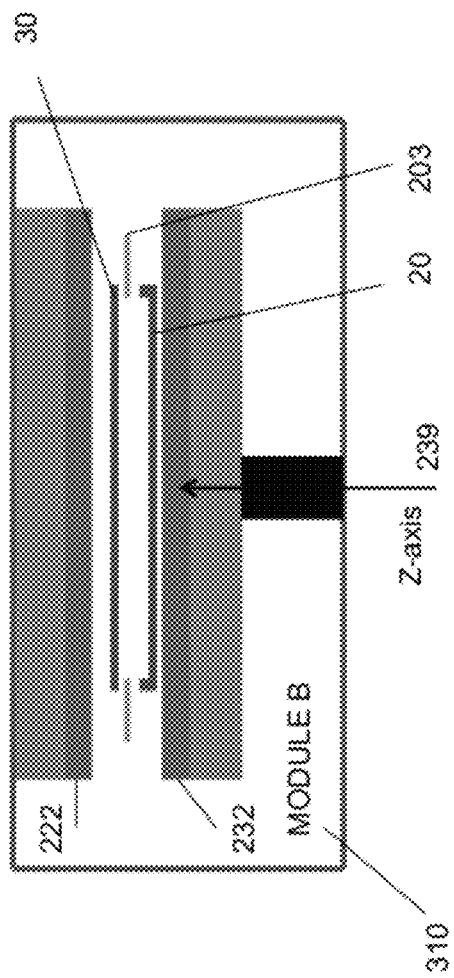
FIG. 2B depicts a schematic cross-sectional view of the bonder module B of FIG. 1 and a list of the process steps for performing the temporary wafer bonding process B of FIG. 2A.

Referring to FIG. 2B, the device wafer 20 is placed in the fixture chuck 202 (shown in FIG. 4) with the adhesive layer facing up. Next, spacers 203 are placed on top of the device wafer 20 and then the carrier wafer 30 is placed on top of the spacers and the assembled fixture chuck 202 is transferred to the bonder module B 310. The chamber is evacuated, the spacers 203 are removed and the carrier wafer 30 is dropped onto the device wafer 20. In some embodiments, the carrier wafer 30 is dropped onto the device wafer 20 by purging nitrogen or other inert gas through vacuum grooves formed in the upper chuck 222. In other embodiments the upper chuck 222 is an electrostatic chuck (ESC) and the carrier wafer 30 is dropped onto the device wafer 20 by reversing the polarity of the ESC. Next, a low force is applied by purging the chamber with a low pressure gas and the temperature is raised to 200° C. for the formation of the bond. Next, the chamber is cooled and the fixture is unloaded. In other embodiments, the Z-axis 239 moves up and the stacked wafers 20, 30 are brought into contact with the upper chuck 222. The upper chuck 222 may be semi-compliant or non-compliant, as will be described later.

The debond process B 70*b* is a mechanical lift debond process and includes the following steps, shown in FIG. 2A. The bonded wafer stack 10 is mounted onto a dicing frame 25 (54) and the carrier wafer 30 is mechanically lifted away from the device wafer 20 (55). The thinned device wafer 20 remains supported by the dicing frame 25.

Figure 3B:
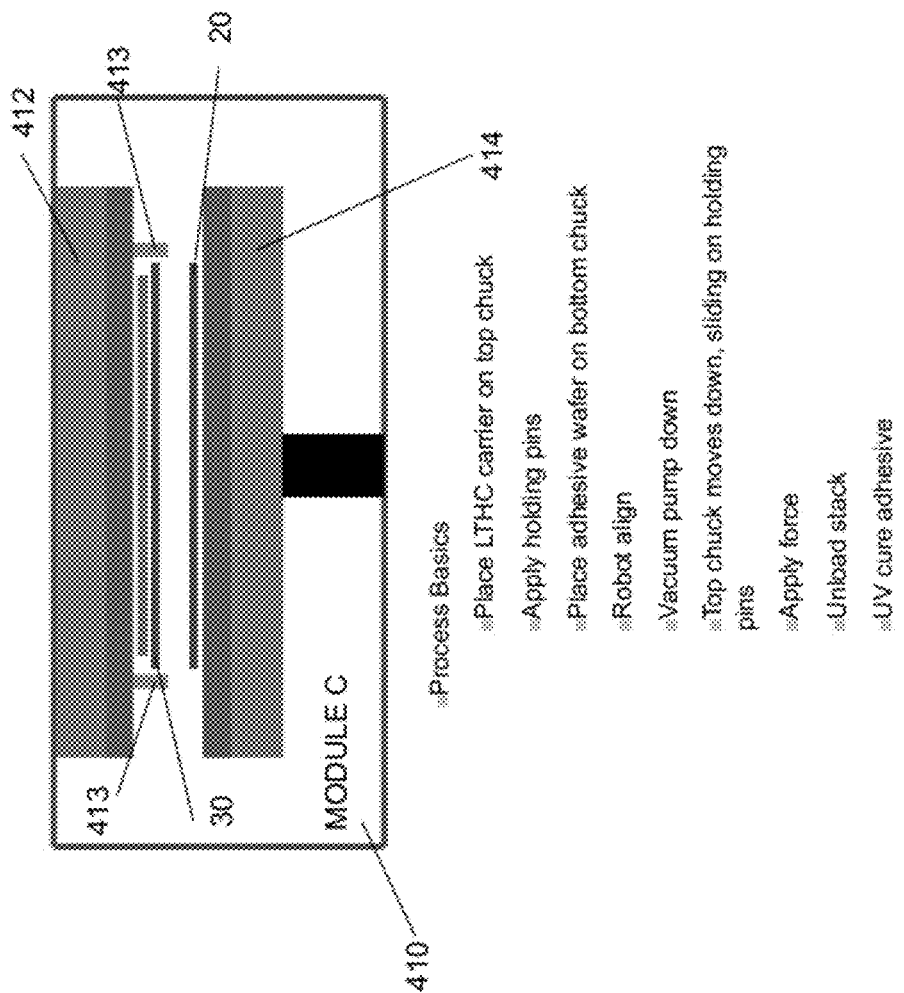
FIG. 3B depicts a schematic cross-sectional view of the bonder module C of FIG. 1, and a list of the process steps for performing the temporary wafer bonding process C of FIG. 3A.
Figure 4:
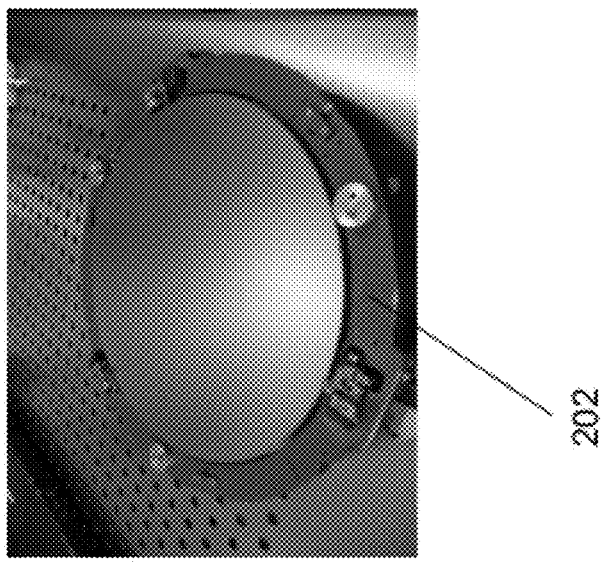
FIG. 4 depicts a view of a fixture chuck.

Referring to FIG. 3A, temporary bond process C, 80*a* includes the following steps. First, a surface of the device wafer 20 is coated with an adhesive layer 23 (82). In one example, adhesive layer 23 is a UV curable adhesive LC3200™, manufactured by 3M Company, MN, USA. The adhesive coated device wafer is then flipped (84). Next, a light absorbing release layer 33 is spin coated on a surface 30a of the carrier wafer 30 (86). In one example, light absorbing release layer 33 is a LC4000, manufactured by 3M Company, MN, USA. Next, the flipped device wafer 20 is aligned with the carrier wafer 30 so that the surface 20a of the device wafer with the adhesive layer 23 is opposite to the surface 30a of the carrier wafer 30 with the light absorbing release layer. The two surfaces 20a and 30a are brought into contact and the adhesive layer is cured with UV light (87). The two wafers are bonded (88) in temporary bonder module C 410, shown in FIG. 3B. The bond is a temporary bond between the light absorbing release layer 33 and the adhesive layer 23 and is formed under vacuum of 0.1 mbar and low applied bond force. The temporary bonding (88) of the carrier wafer to the device wafer occurs in temporary module C, shown in FIG. 3B.

Referring to FIG. 3B, the carrier wafer 30 with the laser absorbing release layer LTHC layer is placed on the top chuck 412 and held in place by holding pins 413. Next, the device wafer 20 is placed on the bottom chuck 414 with the adhesive layer 23 facing up. Next, the wafers 20, 30 are aligned, the chamber is evacuated, and the top chuck 412 with the carrier wafer 30 is dropped onto the device wafer 20. A low force is applied for the formation of the bond between the release layer 33 and the adhesive layer 23. Next, the bonded wafer stack 10 is unloaded and the adhesive is cured with UV light.

Referring back to FIG. 3A, the debond process C 80b includes the following steps. The bonded wafer stack 10 is mounted onto a dicing frame 25 (56) and the carrier wafer 30 is illuminated with a YAG laser beam. The laser beam causes the separation of the wafer stack along the release layer 33 (57) and the separated carrier wafer 30 is mechanically lifted away from the device wafer 20 (58). The adhesive layer is peeled away from the device wafer surface 20a (59) and the thinned device wafer 20 remains supported by the dicing frame 25.

Figure 6:
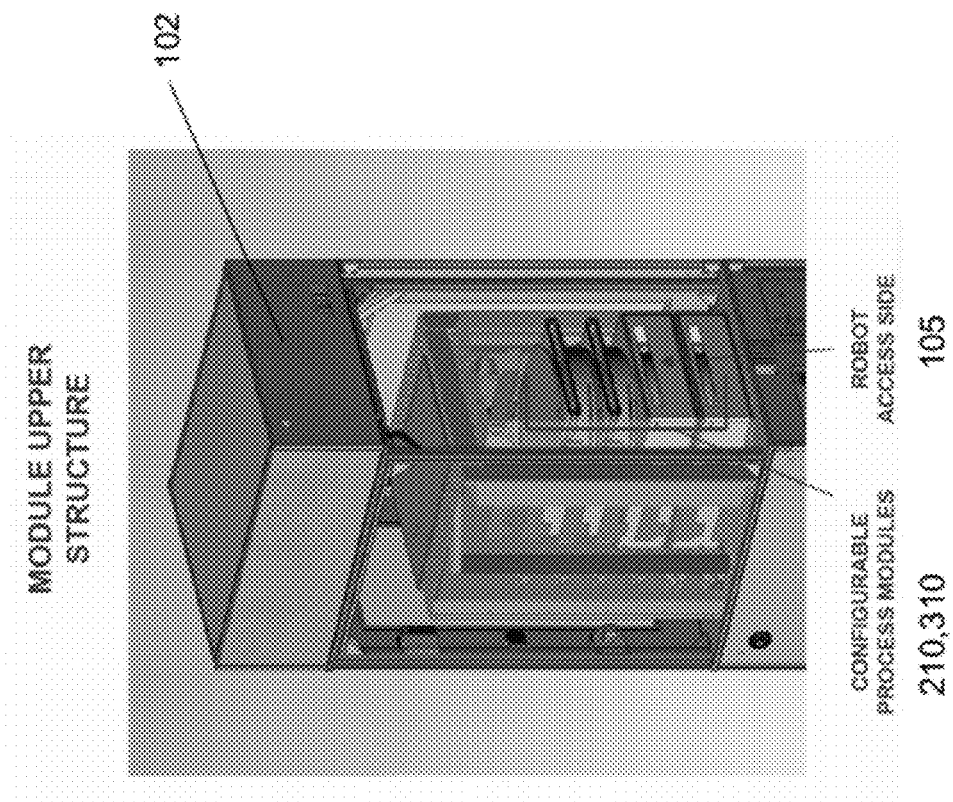
FIG. 6 depicts a closer view of the upper structure of the temporary wafer bonder cluster of FIG. 5.
Figure 5:
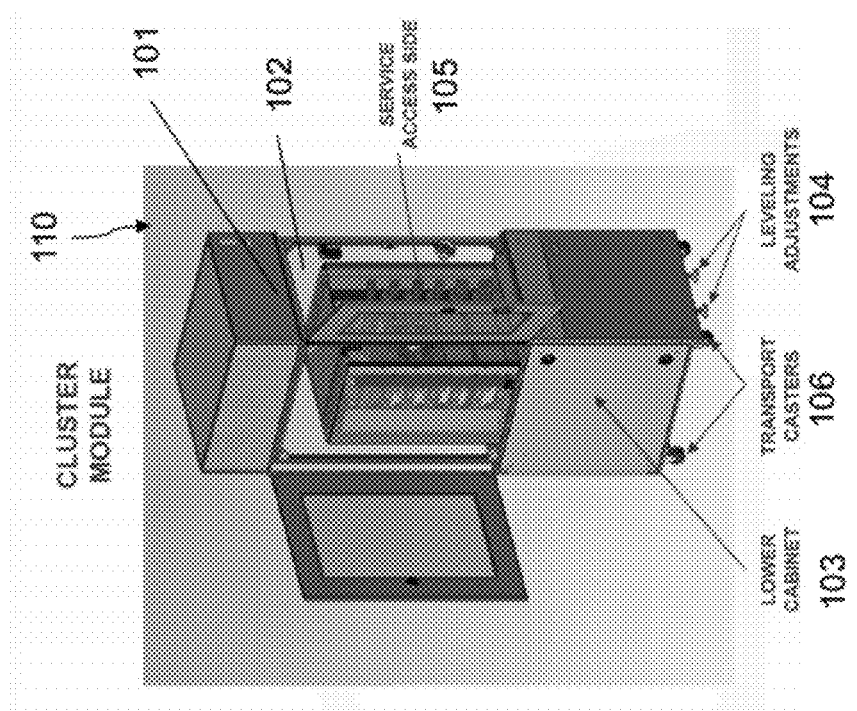
FIG. 5 depicts the temporary wafer bonder cluster of FIG. 1.
Figure 7:
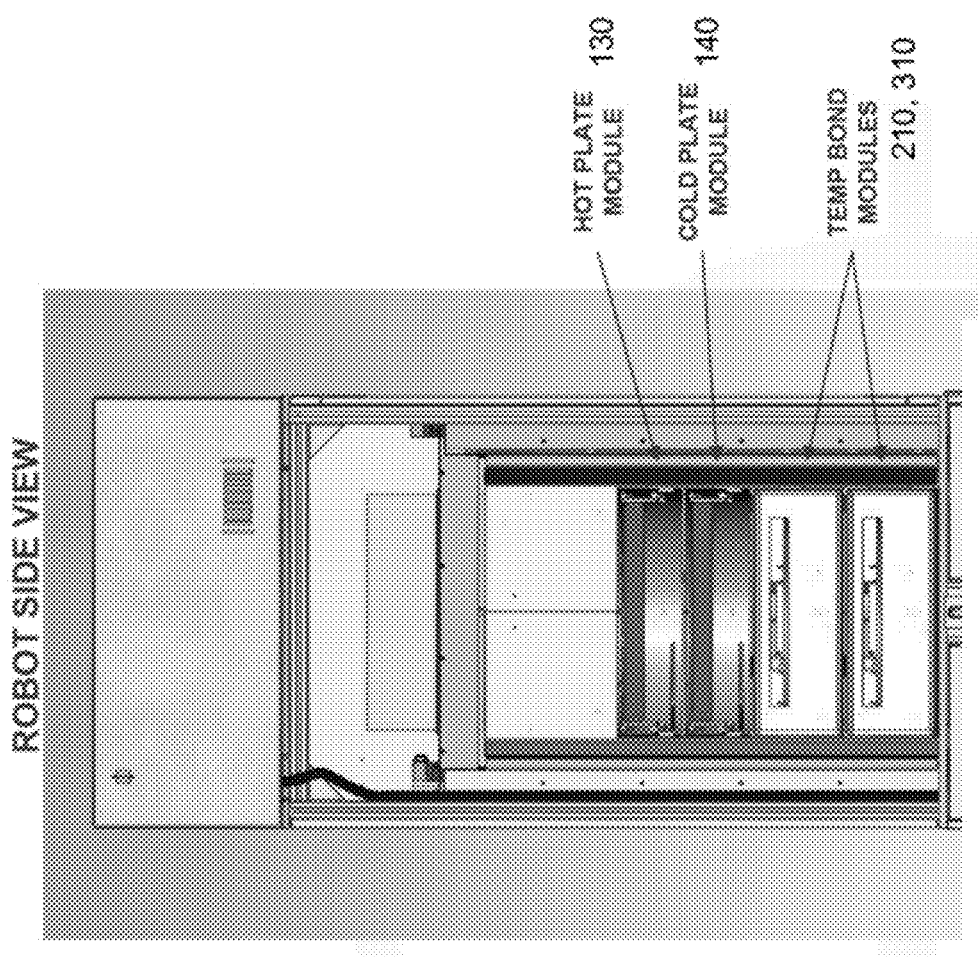
FIG. 7 depicts a cross-sectional view of the upper structure of the temporary wafer bonder cluster of FIG. 5.
Figure 8:
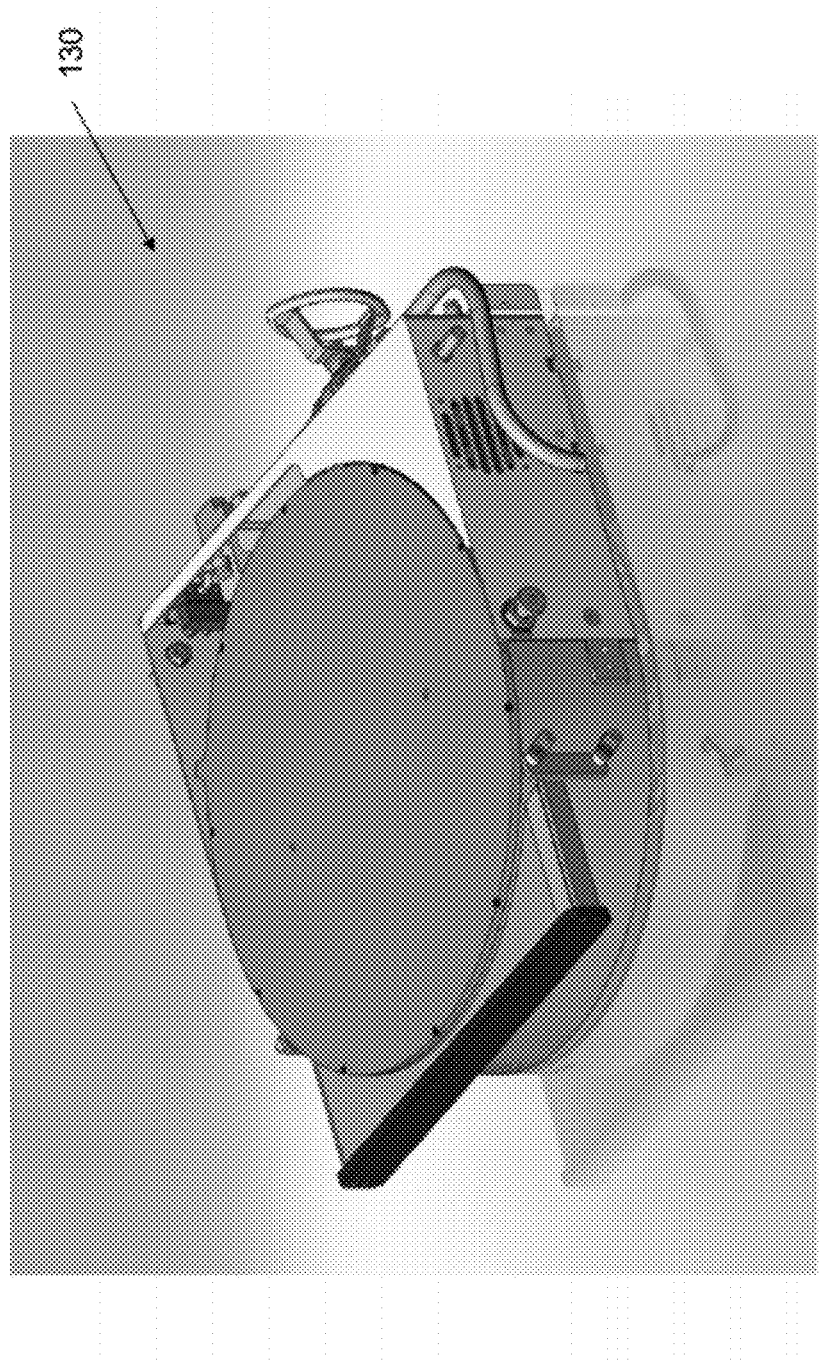
FIG. 8 depicts the hot plate module of the temporary wafer bonder cluster of FIG. 7.
Figure 9:
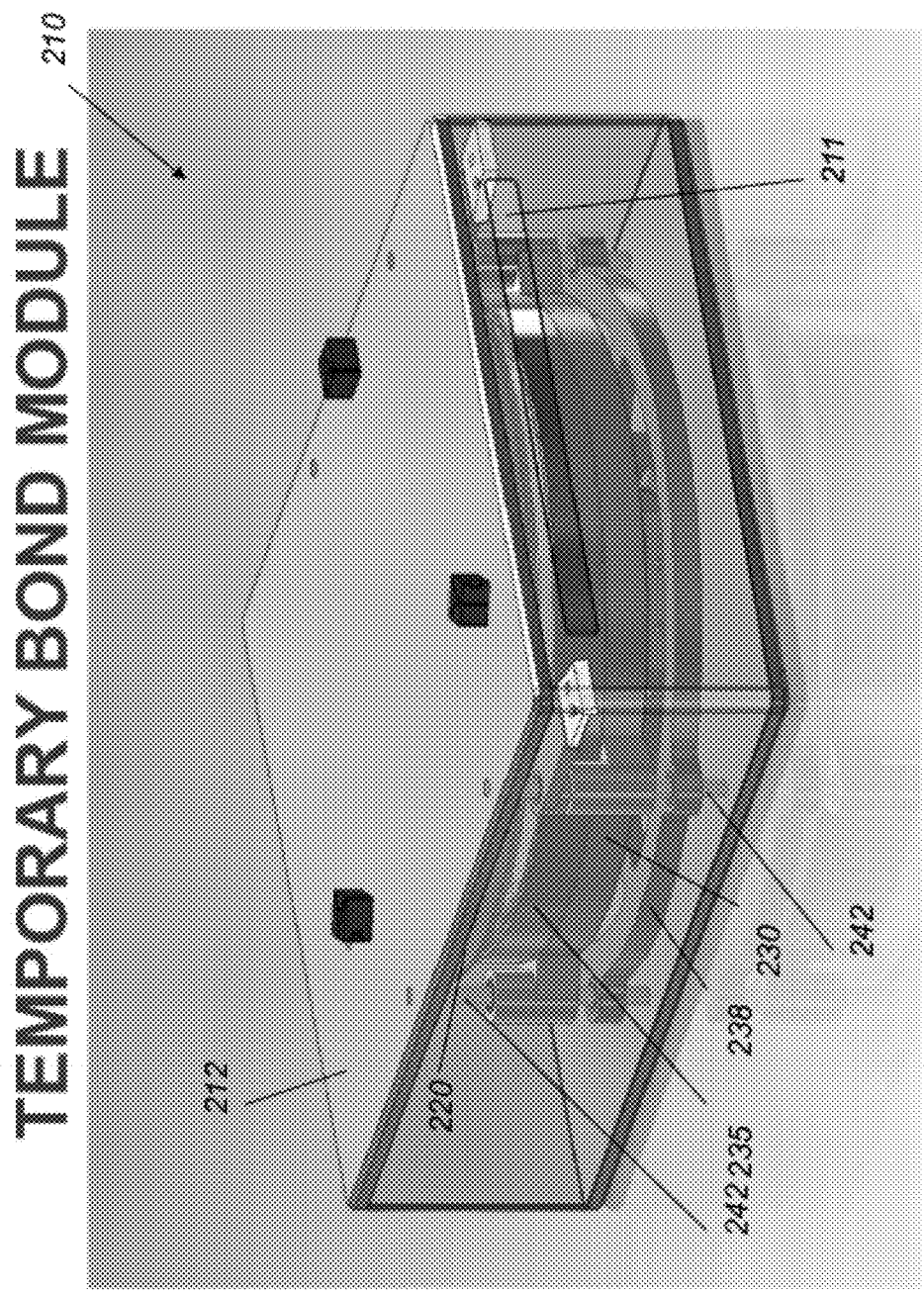
FIG. 9 depicts a temporary bond module of the wafer bonder cluster of FIG. 7.
Figure 10:
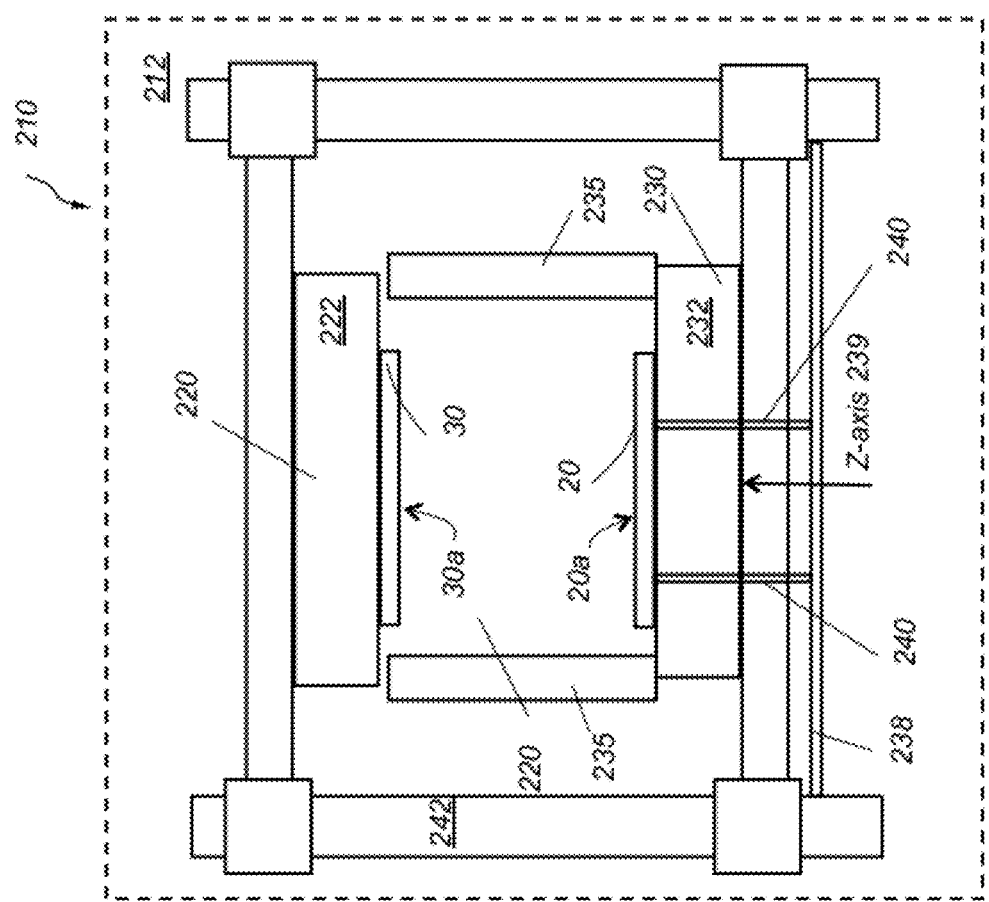
FIG. 10 depicts a schematic cross-sectional diagram of the temporary bonder module of FIG. 9.

Referring to FIG. 5, temporary bonder cluster 110 includes a housing 101 having an upper cabinet structure 102 stacked on top of a lower cabinet 103. The upper cabinet 102 has a service access side 105 and the lower cabinet has leveling adjustments 104 and transport casters 106. Within the upper cabinet structure 102 the configurable temporary bond process modules 210, 310, 410, 510 are vertically stacked, as shown in FIG. 6. Hot plate modules 130 and cold plate modules 140 are also vertically stacked on top, below or in-between the process modules 210, 310, as shown in FIG. 7. Additional process modules may be included in order to provide further processing functionalities. Examples of the bond process modules include low applied force module, high applied force module, high temperature and low temperature modules, illumination (UV light or laser) modules, high pressure (gas) module, low (vacuum) pressure module and combinations thereof.

Referring to FIG. 9-FIG. 12, temporary bond module 210 includes a housing 212 having a load door 211, an upper block assembly 220 and an opposing lower block assembly 230. The upper and lower block assemblies 220, 230 are movably connected to four Z-guide posts 242. In other embodiments, less than four or more than four Z-guide posts are used. A telescoping curtain seal 235 is disposed between the upper and lower block assemblies 220, 230. A temporary bonding chamber 202 is formed between the upper and lower assemblies 220, 230 and the telescoping curtain seal 235. The curtain seal 235 keeps many of the process components that are outside of the temporary bonding chamber area 202 insulated from the process chamber temperature, pressure, vacuum, and atmosphere. Process components outside of the chamber area 202 include guidance posts 242, Z-axis drive 243, illumination sources, mechanical pre-alignment arms 460a, 460b and wafer centering jaws 461a, 461b, among others. Curtain 235 also provides access to the bond chamber 202 from any radial direction.

Figure 11:
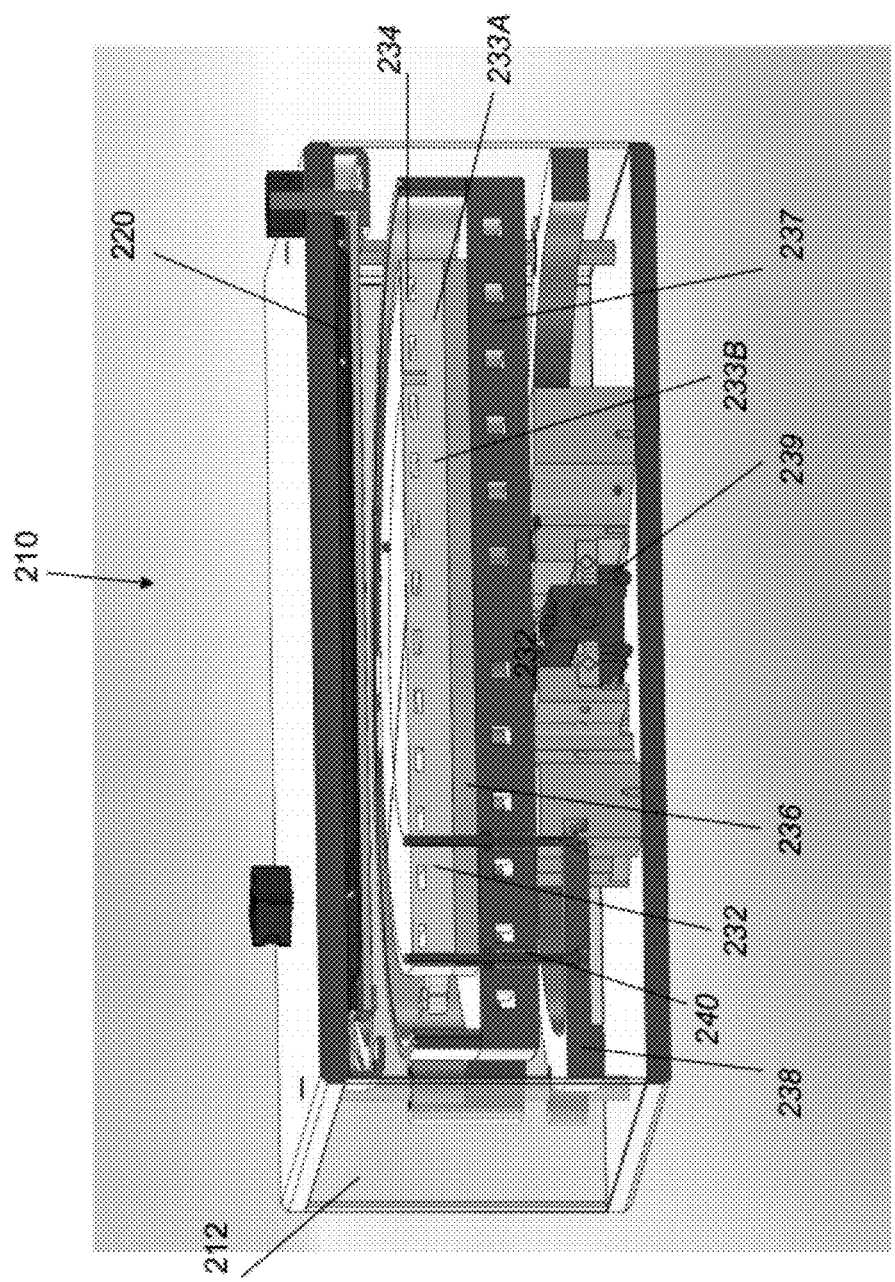
FIG. 11 depicts a cross-sectional view of the temporary wafer bonder module of FIG. 9 perpendicular to the load direction.
Figure 12:
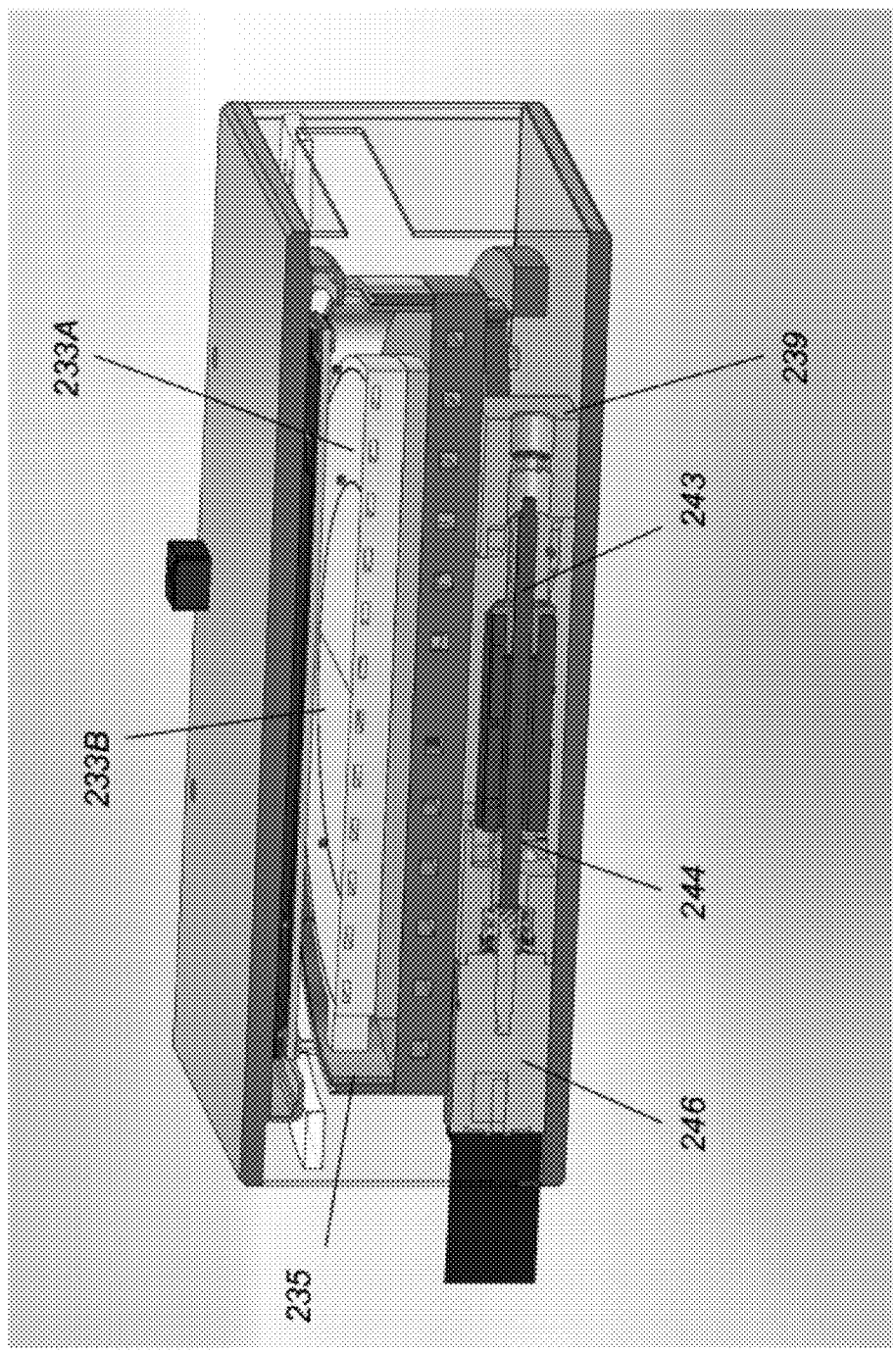
FIG. 12 depicts a cross-sectional view of the temporary wafer bonder module of FIG. 9 in line with the load direction.
Figure 15:
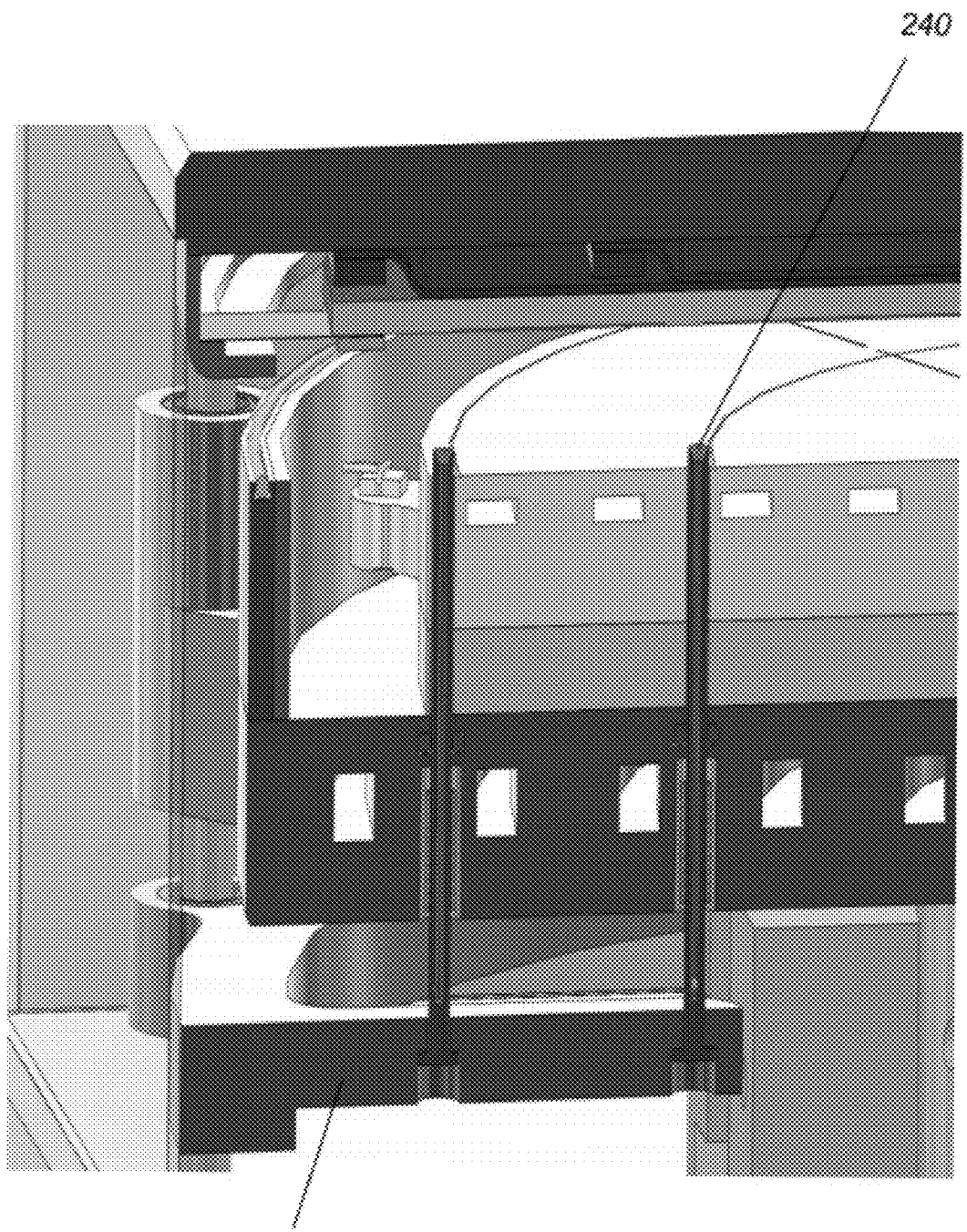
FIG. 15 depicts a detailed cross-sectional view of the temporary wafer bonder module of FIG. 9.

Referring to FIG. 11, the lower block assembly 230 includes a heater plate 232 supporting the wafer 20, an insulation layer 236, a water cooled support flange 237 a transfer pin stage 238 and a Z-axis block 239. Heater plate 232 is a ceramic plate and includes resistive heater elements 233 and integrated air cooling 234. Heater elements 233 are arranged so the two different heating zones are formed. A first heating zone 233B is configured to heat a 200 mm wafer or the center region of a 300 mm wafer and a second heating zone 233A is configured to heat the periphery of the 300 mm wafer. Heating zone 233A is controlled independently from heating zone 233B in order to achieve thermal uniformity throughout the entire bond interface 405 and to mitigate thermal losses at the edges of the wafer stack. Heater plate 232 also includes two different vacuum zones for holding wafers of 200 mm and 300 mm, respectively. The water cooled thermal isolation support flange 237 is separated from the heater plate by the insulation layer 236. The transfer pin stage 238 is arranged below the lower block assembly 230 and is movable supported by the four posts 242. Transfer pin stage 238 supports transfer pins 240 arranged so that they can raise or lower different size wafers. In one example, the transfer pins 240 are arranged so that they can raise or lower 200 mm and 300 mm wafers. Transfer pins 240 are straight shafts and, in some embodiments, have a vacuum feed opening extending through their center, as shown in FIG. 15. Vacuum drawn through the transfer pin openings holds the supported wafers in place onto the transfer pins during movement and prevents misalignment of the wafers. The Z-axis block 239 includes a precision Z-axis drive 243 with ball screw, linear cam design, a linear encoder feedback 244 for submicron position control, and a servomotor 246 with a gearbox, shown in FIG. 12.

Figure 13:
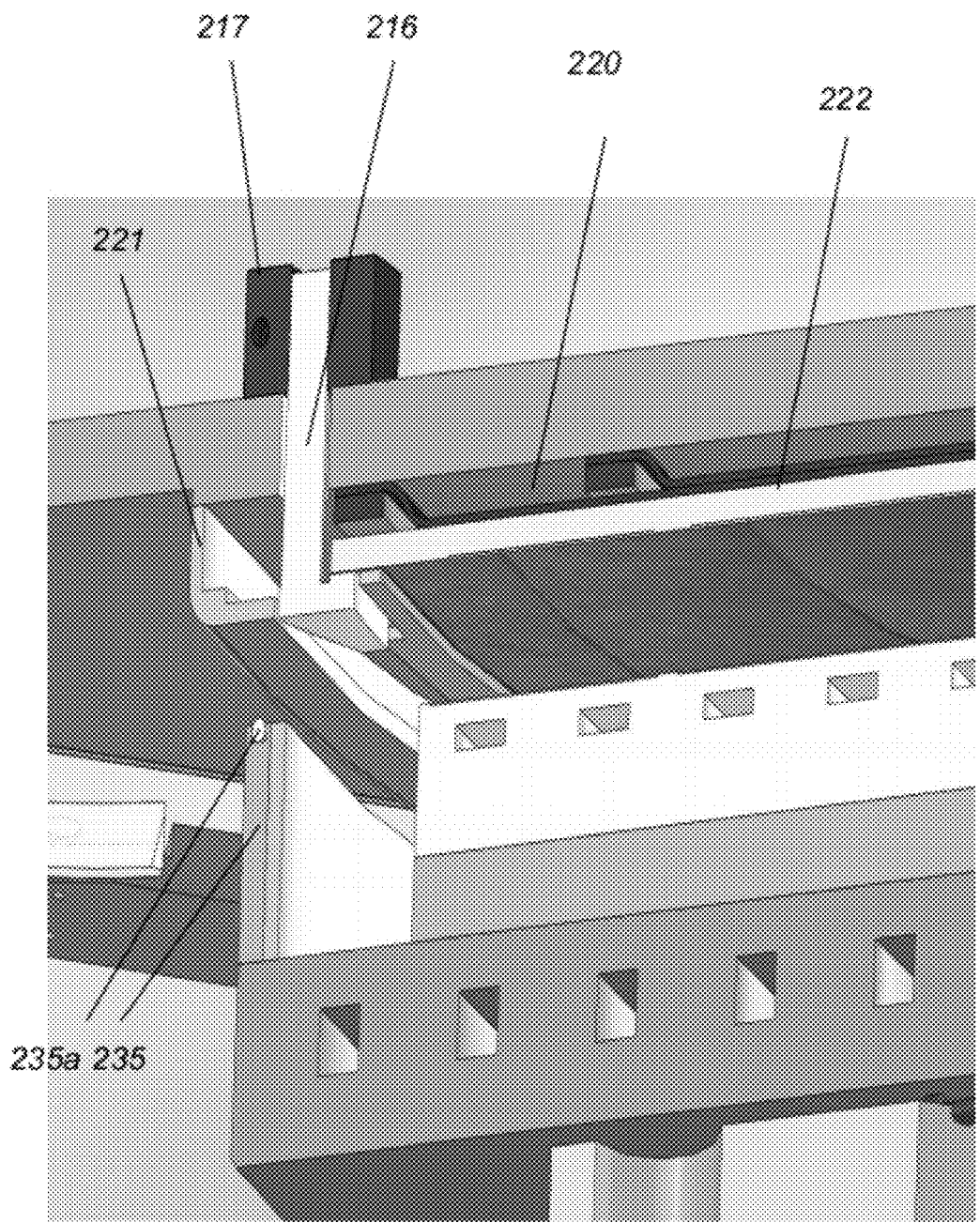
FIG. 13 depicts the top chuck leveling adjustment in the temporary wafer bonder module of FIG. 9.
Figure 14:
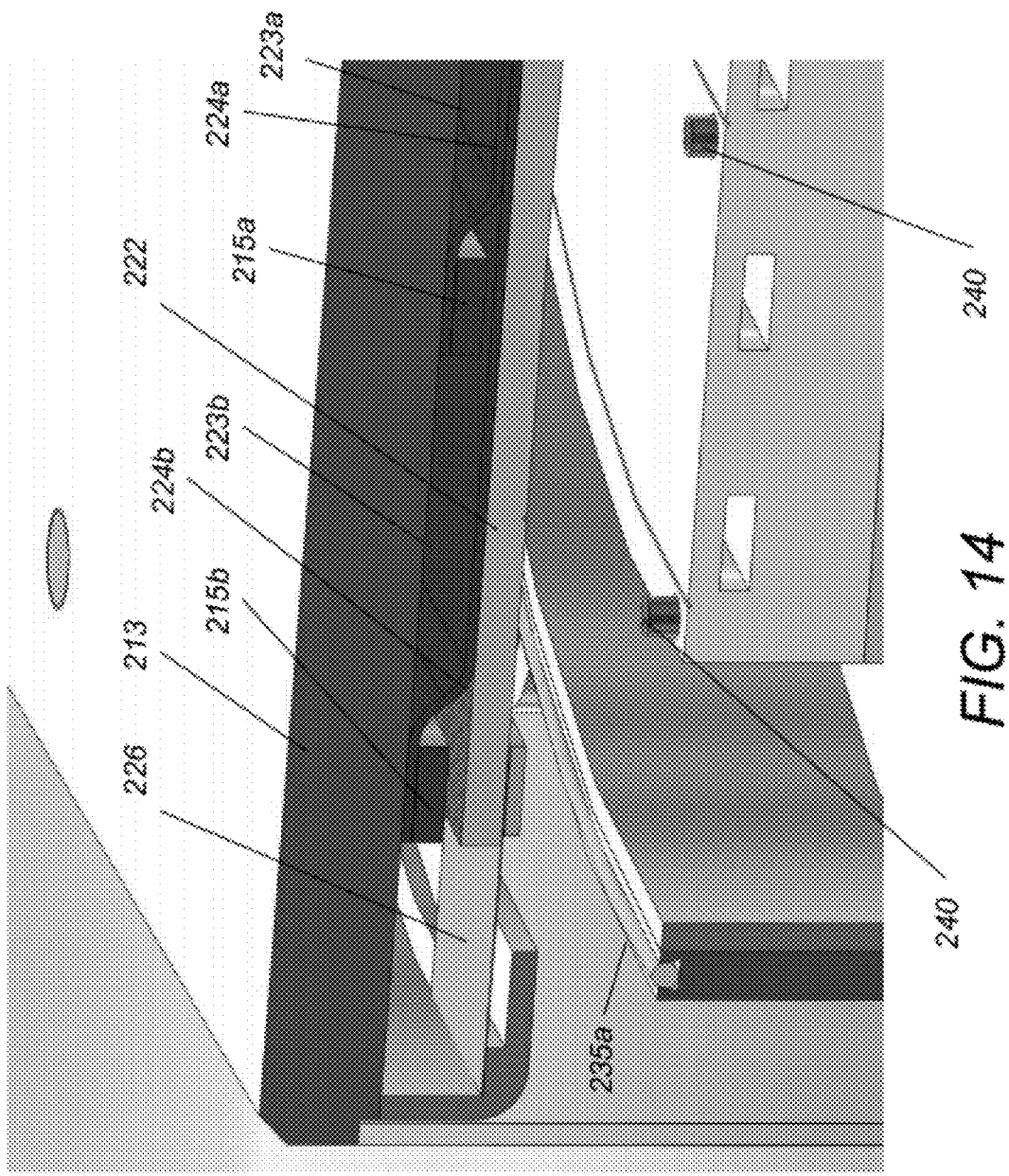
FIG. 14 depicts a cross-sectional view of the top chuck of the temporary wafer bonder module of FIG. 9.

Referring to FIG. 13, the upper block assembly 220 includes an upper ceramic chuck 222, a top static chamber wall 221 against which the curtain 235 seals with seal element 235a, a 200 mm and a 300 mm membrane layers 224a, 224b, and three metal flexure straps 226 arranged circularly at 120 degrees. The membrane layers 224a, 224b, are clamped between the upper chuck 222 and the top housing wall 213 with clamps 215a, 215b, respectively, and form two separate vacuum zones 223a, 223b designed to hold 200 mm and 300 mm wafers, respectively, as shown in FIG. 14. Membrane layers 224a, 224b are made of elastomer material or metal bellows. The upper ceramic chuck 222 is highly flat and thin. It has low mass and is semi-compliant in order to apply uniform pressure upon the wafer stack 10. The upper chuck 222 is lightly pre-loaded with membrane pressure against three adjustable leveling clamp/drive assemblies 216. Clamp/drive assemblies 216 are circularly arranged at 120 degrees. The upper chuck 222 is initially leveled while in contact with the lower ceramic heater plate 232, so that it is parallel to the heater plate 232. The three metal straps 226 act a flexures and provide X-Y-T (Theta) positioning with minimal Z-constraint for the upper chuck 222. The clamp/drive assemblies 216 also provide a spherical Wedge Error Compensating (WEC) mechanism that rotates and/or tilts the ceramic chuck 222 around a center point corresponding to the center of the supported wafer without translation. In other embodiments, the upper ceramic chuck 222 positioning is accomplished with fixed leveling/locating pins, against which the chuck 222 is lashed.

Figure 16:
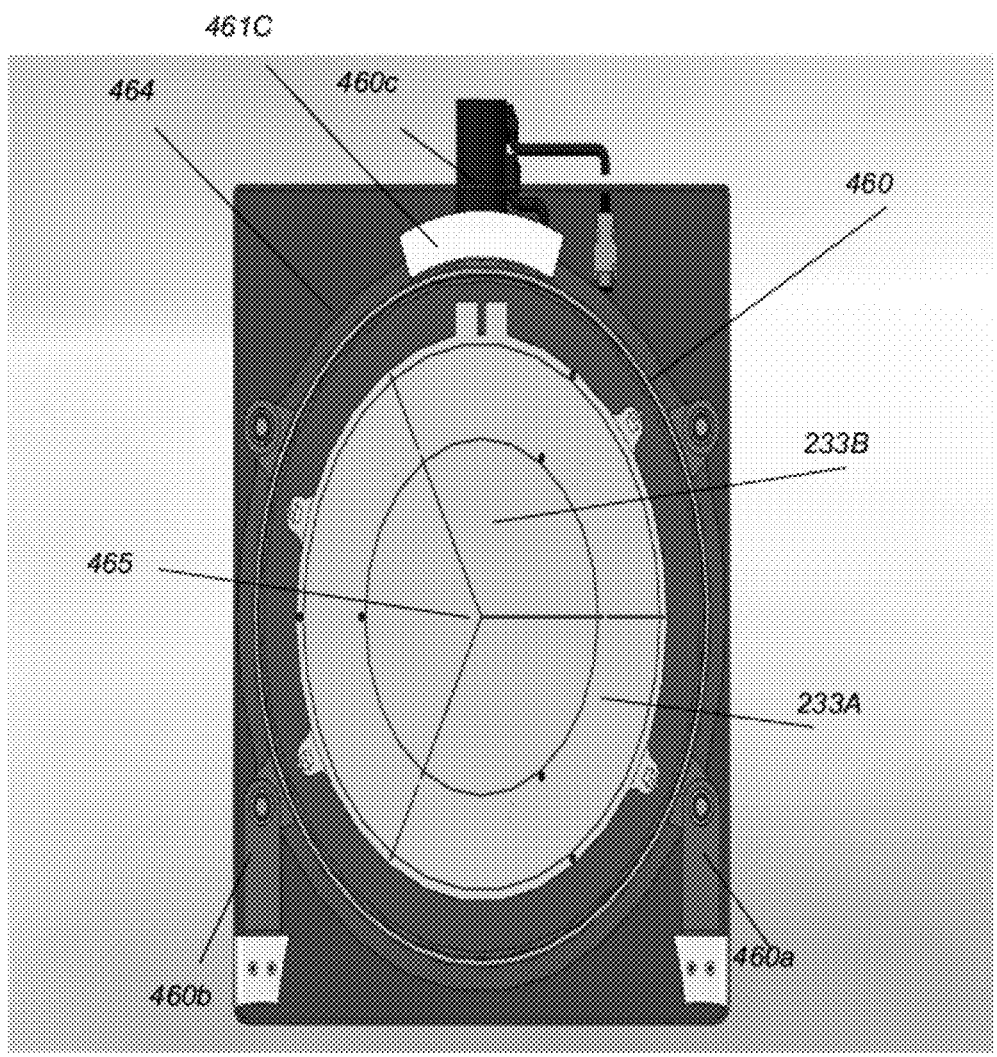
FIG. 16 depicts a wafer centering device with the pre-alignment arms in the open position.
Figure 18A:
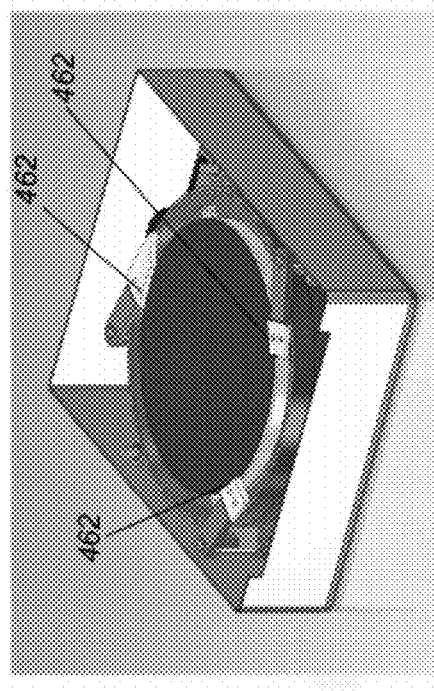
FIG. 18A depicts the pre-alignment of a 300 mm wafer.
Figure 18B:
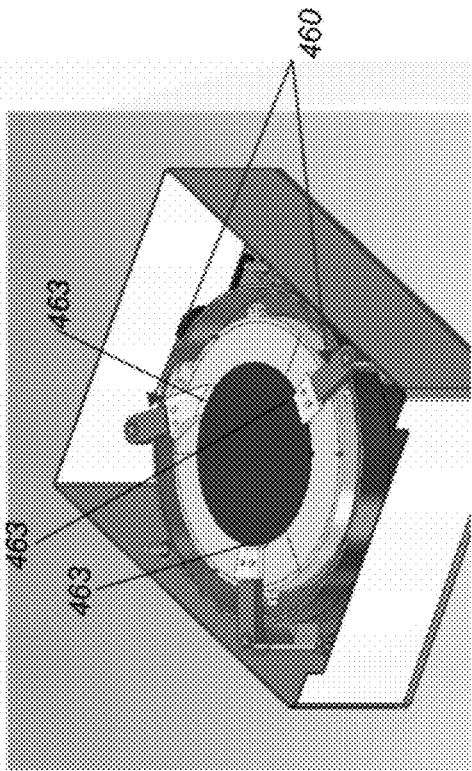
FIG. 18B depicts the pre-alignment of a 200 mm wafer.

The loading and pre-alignment of the wafers is facilitated with the mechanical centering device 460, shown in FIG. 16. Centering device 460 includes two rotatable pre-alignment arms 460a, 460b and a linearly moving alignment arm 460c, shown in the open position in FIG. 16 and in the closed position in FIG. 17. At the ends of each arm 460a, 460b there are mechanical jaws 461a, 461b. The mechanical jaws 461a, 461b have tapered surfaces 462 and 463 that conform to the curved edge of the 300 mm wafer and 200 mm wafer, respectively, as shown in FIG. 18A and FIG. 18B. The linearly moving arm 460c has a jaw 461c with a tapered curved inner surface that also conforms to the curved edge of circular wafers. Rotating arms 460a, 460b toward the center 465 of the support chuck 464 and linearly moving arm 460c toward the center 465 of the support chuck 464 brings the tapered surfaces of the mechanical jaws 461a, 461b and the tapered curved inner surface of jaw 461c in contact with the outer perimeter of the wafer and centers the wafer on the support chuck 464. The three arms 460a, 460b, 460c are arranged at 120 degrees around the support chuck 464. In another embodiment, the centering device 460 includes three rotatable pre-alignment arms, and at the ends of each arm there are mechanical jaws, as shown in FIG. 18A and FIG. 18B. Rotating the arms toward the center of the support chuck 464 brings the tapered surfaces of the mechanical jaws in contact with the outer perimeter of the wafer and centers the wafer on the support chuck 464.

Figure 19A:
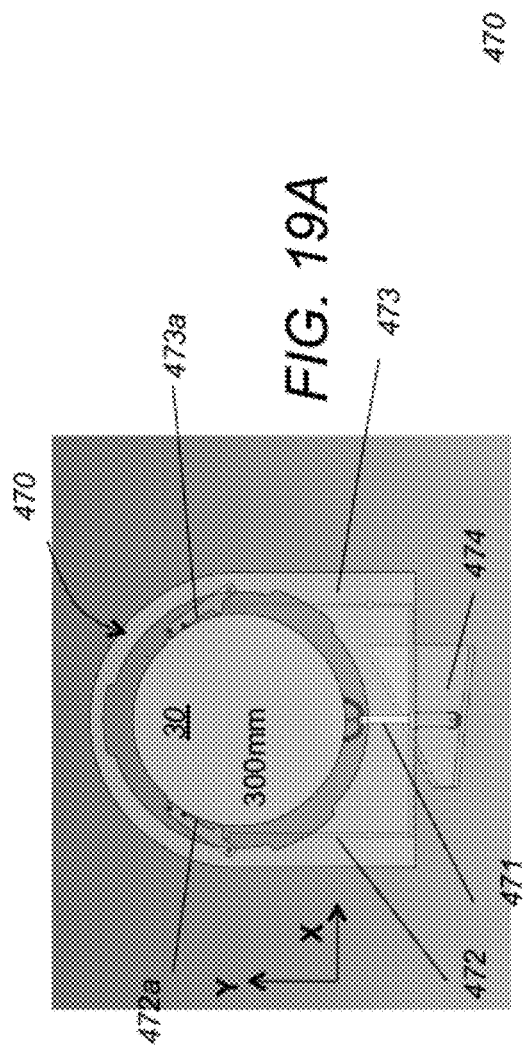
FIG. 19A depicts another wafer centering device for the pre-alignment of a 300 mm wafer.
Figure 19B:
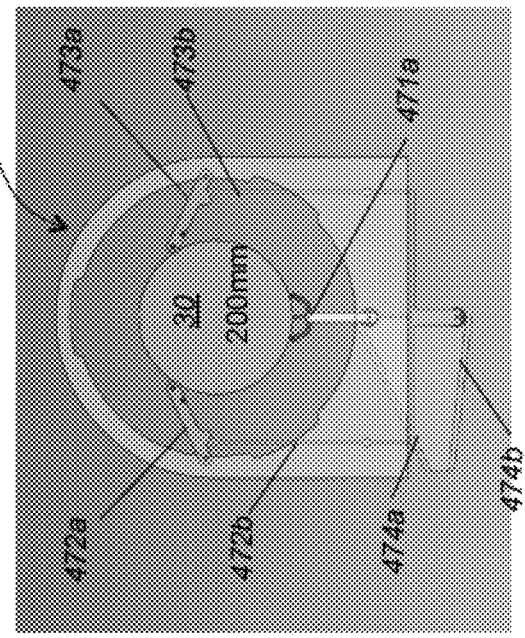
FIG. 19B depicts the wafer centering device of FIG. 19A for the pre-alignment of a 200 mm wafer.

In another embodiment, the loading and pre-alignment of the wafers is facilitated with wafer centering device 470, shown in FIG. 19A and FIG. 19B. Wafer centering device 470 includes three centering linkages 471, 472, 473. Centering linkage 471 includes a rectilinear mid-position air bearing or mechanical slide 471a that moves the wafer 30 in the Y-direction. Centering linkages 472, 473, include rotating centering arms 472a, 473a, that rotate clockwise and counterclockwise, respectively. The motions of the centering linkages 471, 472, 473, are synchronized by the use of a cam plate 474 with two linear cam profiles 474a, 474b. Cam profile 474a provides rectilinear motion for the mid-position centering arm 471 and cam profile 474b provides rectilinear motion for left and right centering arm push rods 472b, 473b. The rectilinear motion of the push rods 472b, 473b, is translated into rotary motion at the cam/cam follower interface at the centering arms 472a, 473a, respectively. The cam plate is 474 fixed to a linear slide that is driven in a rectilinear motion (X-axis motion) by an electric motor or pneumatic actuation. A Linear Variable Differential Transformer (LVDT) or another electrical sensor at the mid-position centering arm 471 mechanism provides distance feedback, which indicates that the centering devices are stopped against the wafer edge. There is a spring preload on the centering device 471a, and when the spring preload is overtaken the LVDT registers a displacement.

In yet another embodiment, the loading and pre-alignment of the wafer 30 is facilitated with wafer centering device 480, shown in FIG. 19C and FIG. 19D. Wafer centering device 400 includes three centering linkages 481, 482, 483. Centering linkage 481 includes a rectilinear mid-position air bearing or mechanical slide 481a that moves the wafer 30 in the Y-direction. Centering linkages 482, 483, include rotating centering arms 482a, 483a, that rotate clockwise and counterclockwise, respectively. The motions of the centering linkages 481, 482, 483, are synchronized by the use of two plates 484, 485 that include linear cam profiles 484a, 484b, respectively. Cam profiles 484a, 485a provide rectilinear motion for left and right centering arm push rods 482, 483, respectively. The rectilinear motion of the push rods 482, 483, is translated into rotary motion at the cam/cam follower interface at the centering arms 486a, 486b, respectively. Plates 484, 485 are connected to linear slide 481a via rods 481a, 481b, respectively. The linear motion of slide 481a in the Y direction is translated via the rods 486a, 486b, into linear motion of plates 484, 485, respectively, along the X-axis, as shown in FIG. 19D.

Figure 20A:
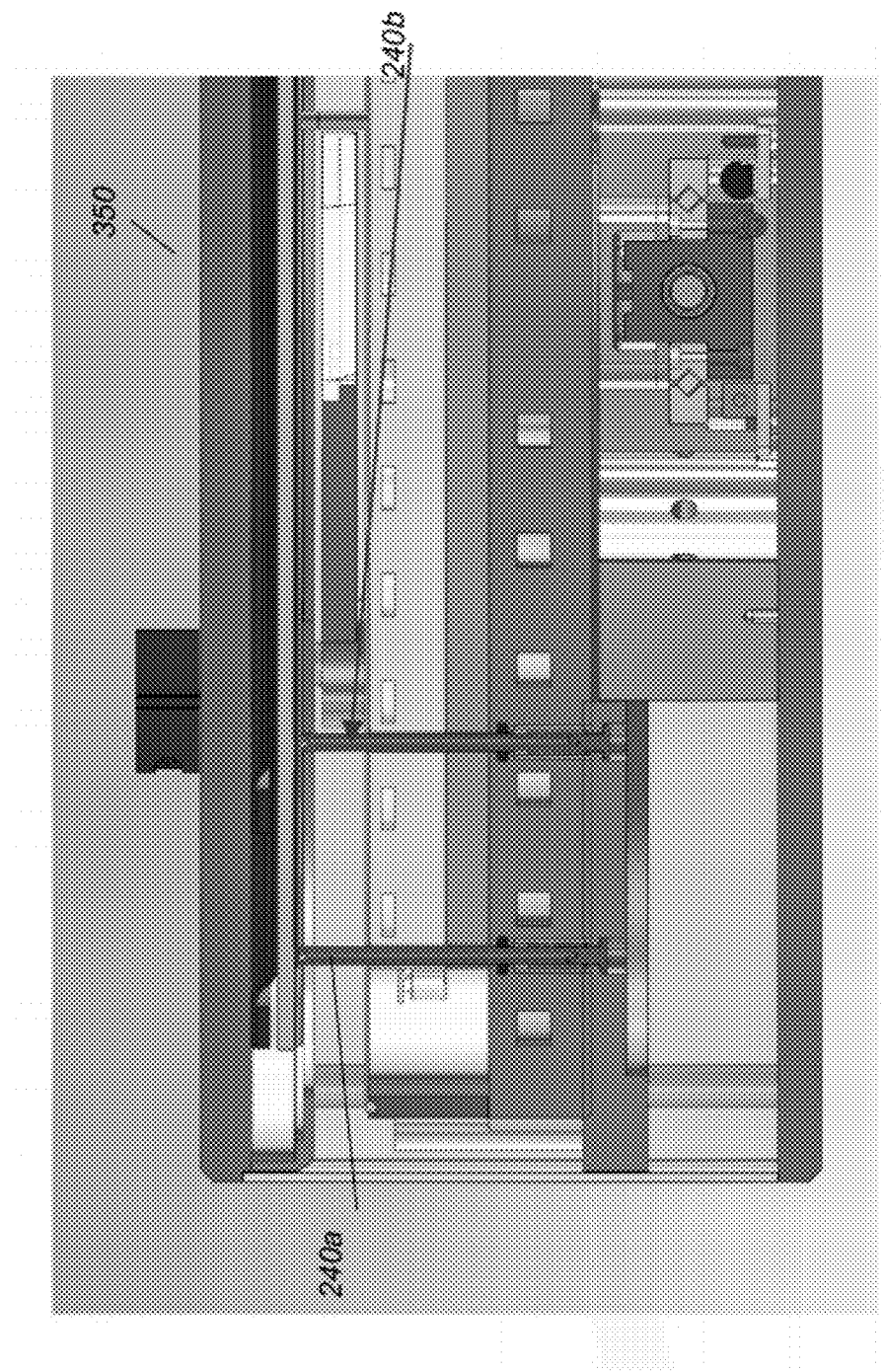
FIG. 20A, FIG. 20B and FIG. 20C depict the loading of the non-adhesive substrate and its transfer to the upper chuck.
Figure 20B:
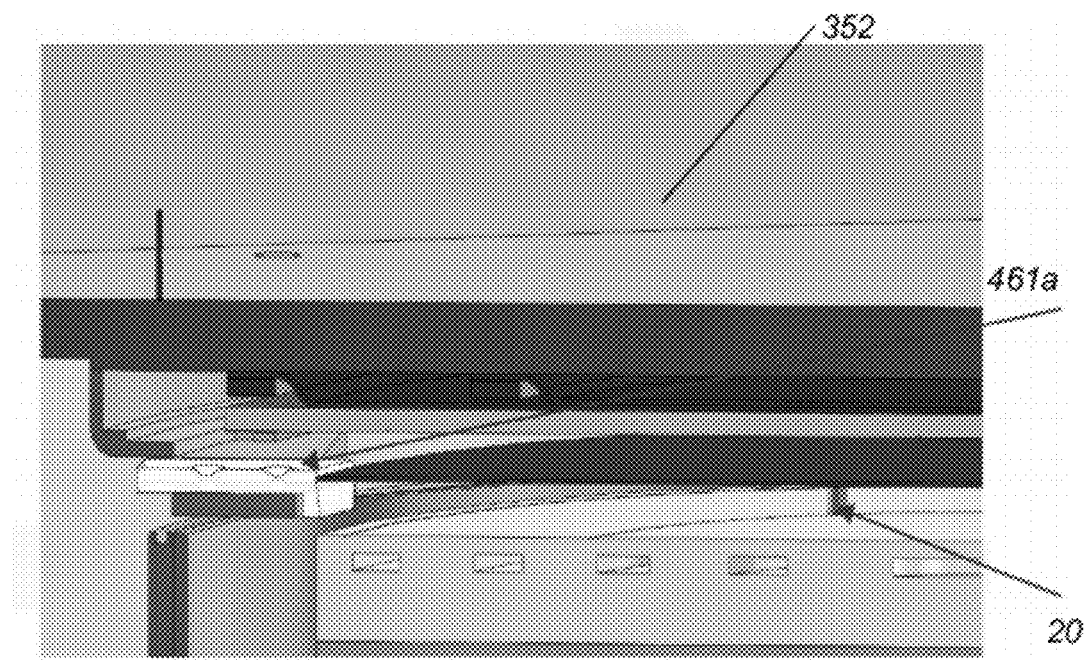
Figure 20C:
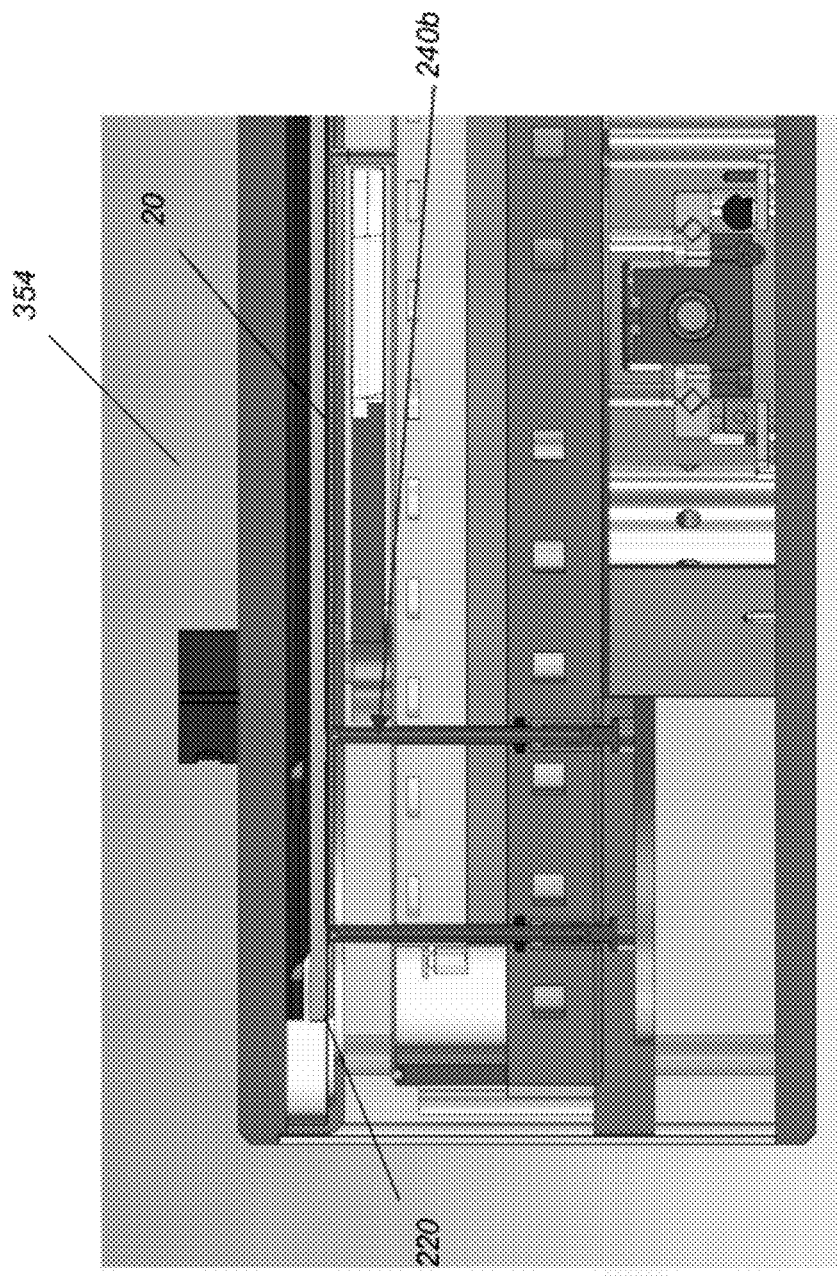
Figure 21A:
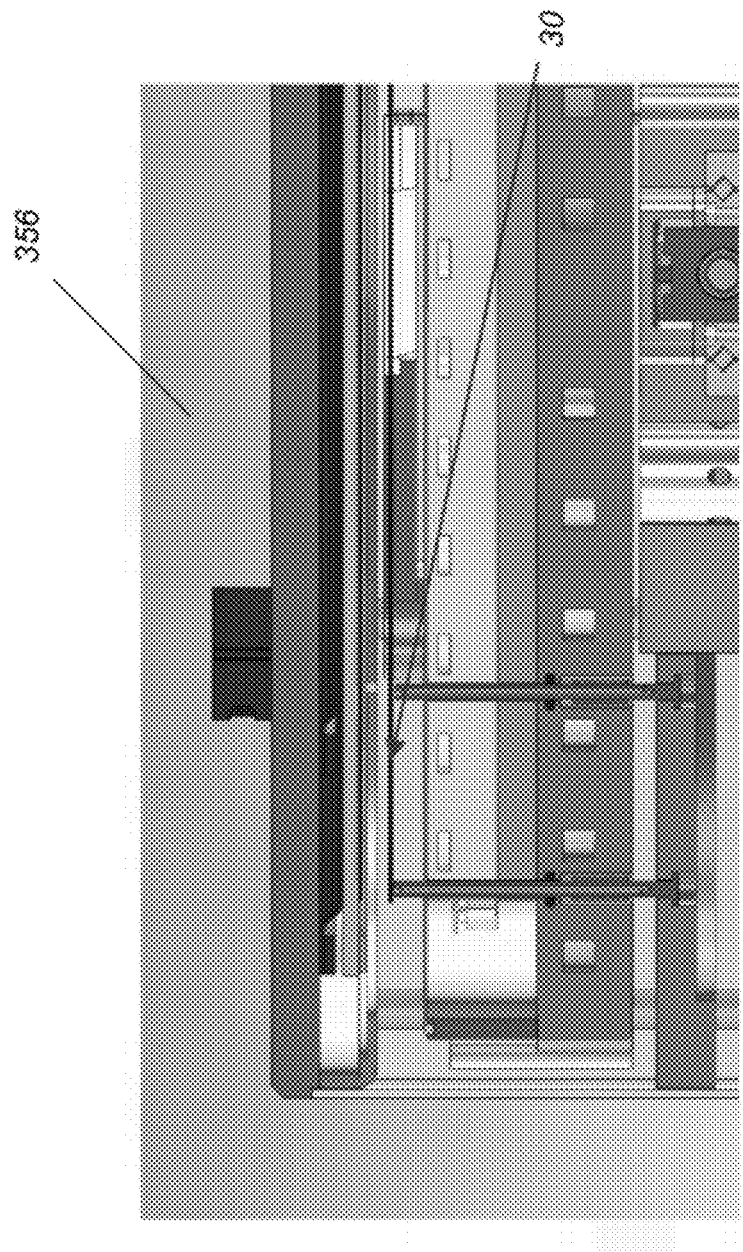
FIG. 21A, FIG. 21B and FIG. 21C depict the loading of the adhesive substrate and its transfer to the lower chuck.
Figure 21B:
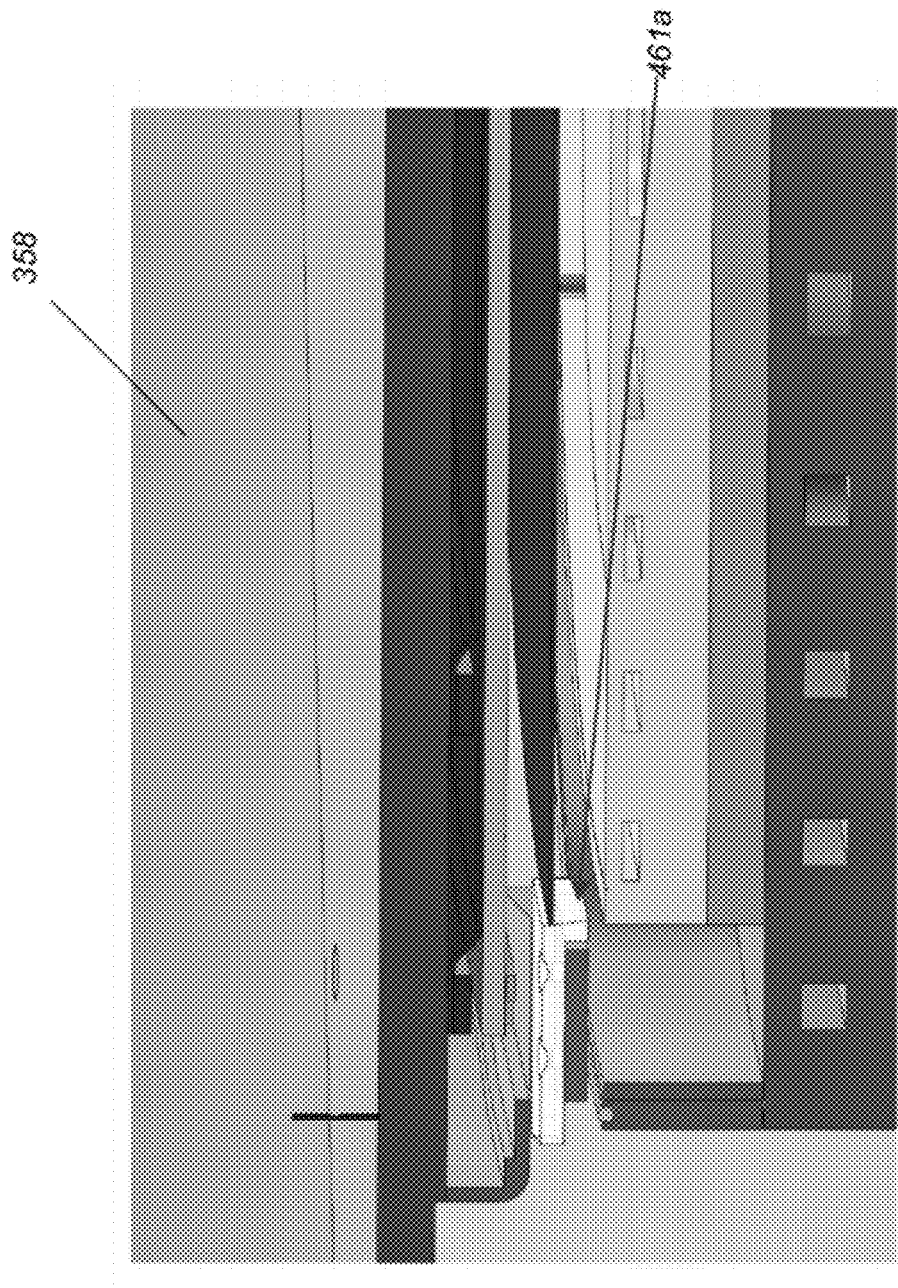
Figure 21C:
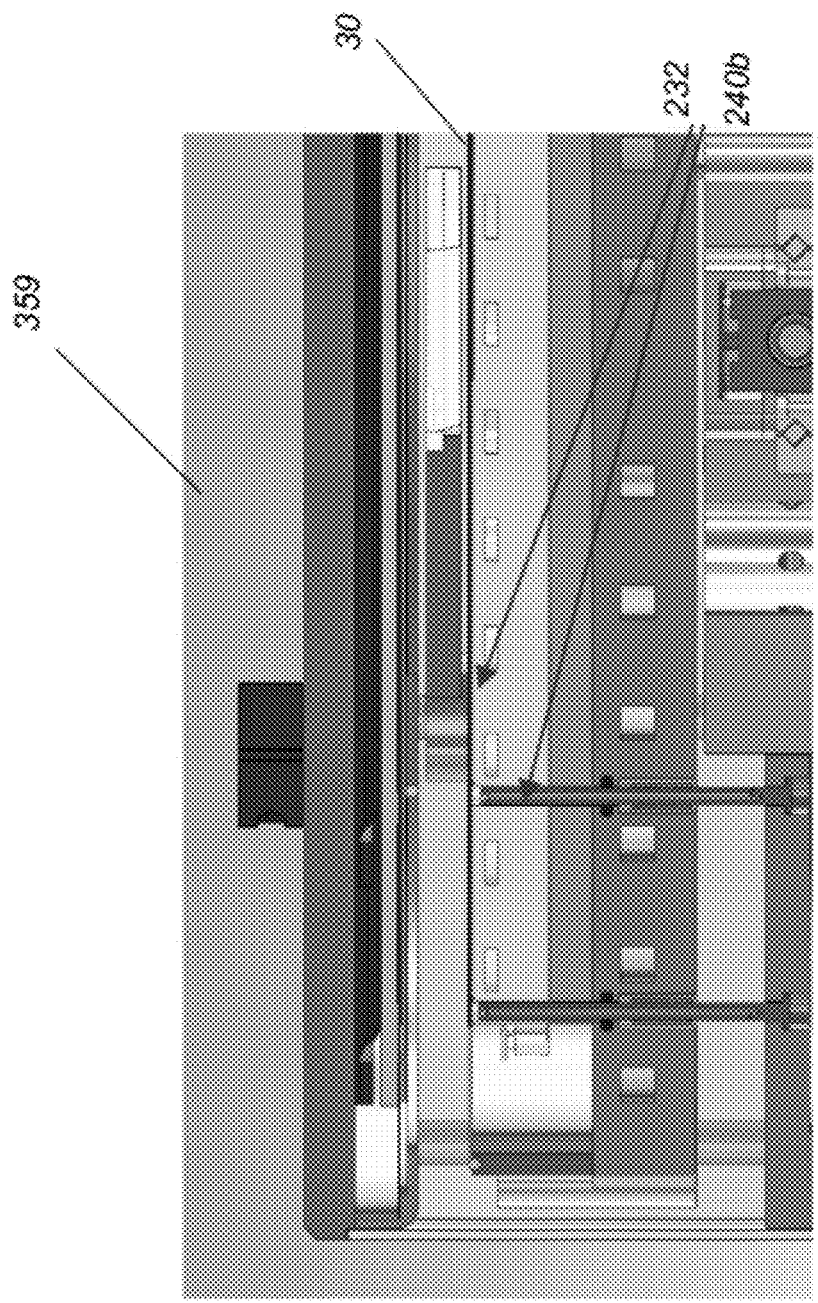
Figure 22A:
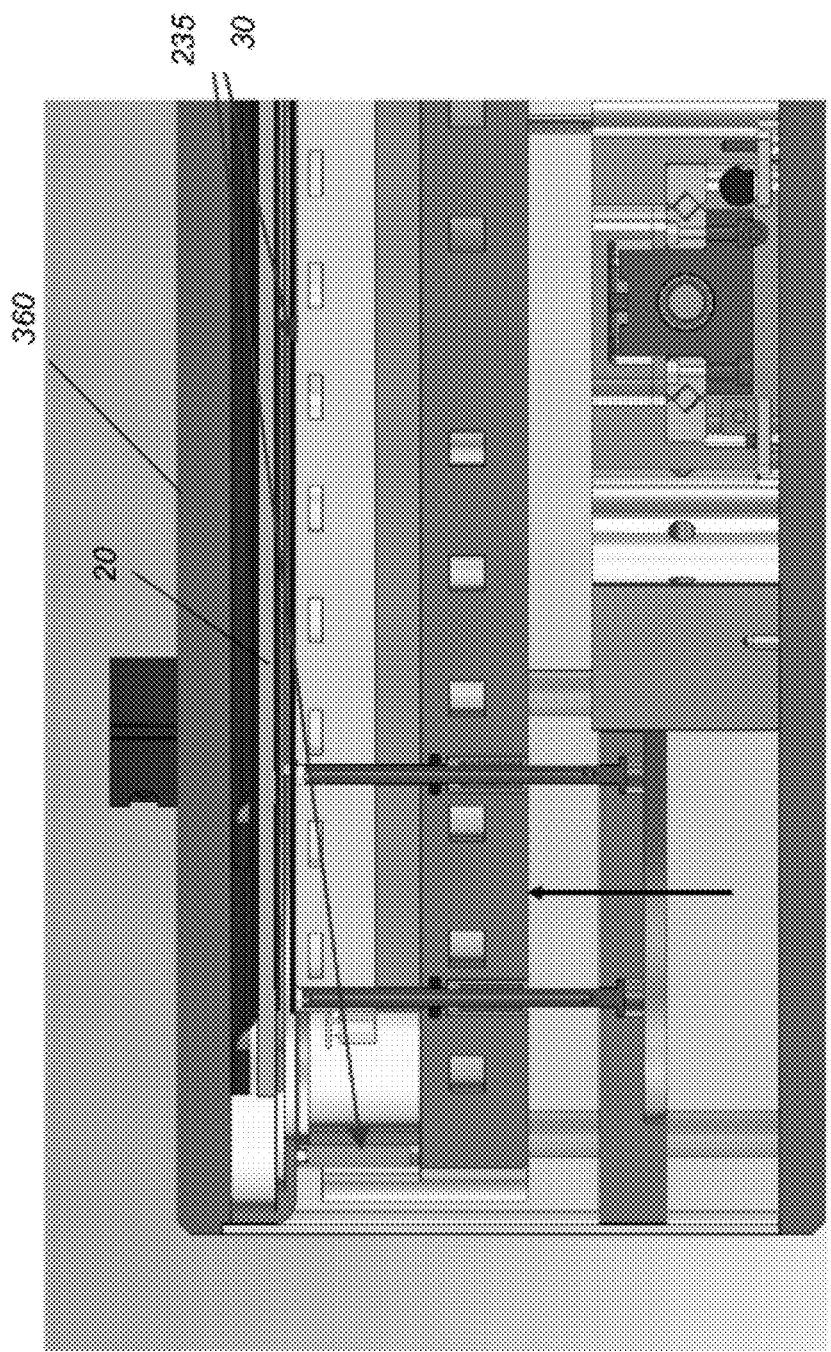
FIG. 22A and FIG. 22B depict bringing the adhesive substrate in contact with the non-adhesive substrate and the formation of a temporary bond between the two substrates.
Figure 22B:
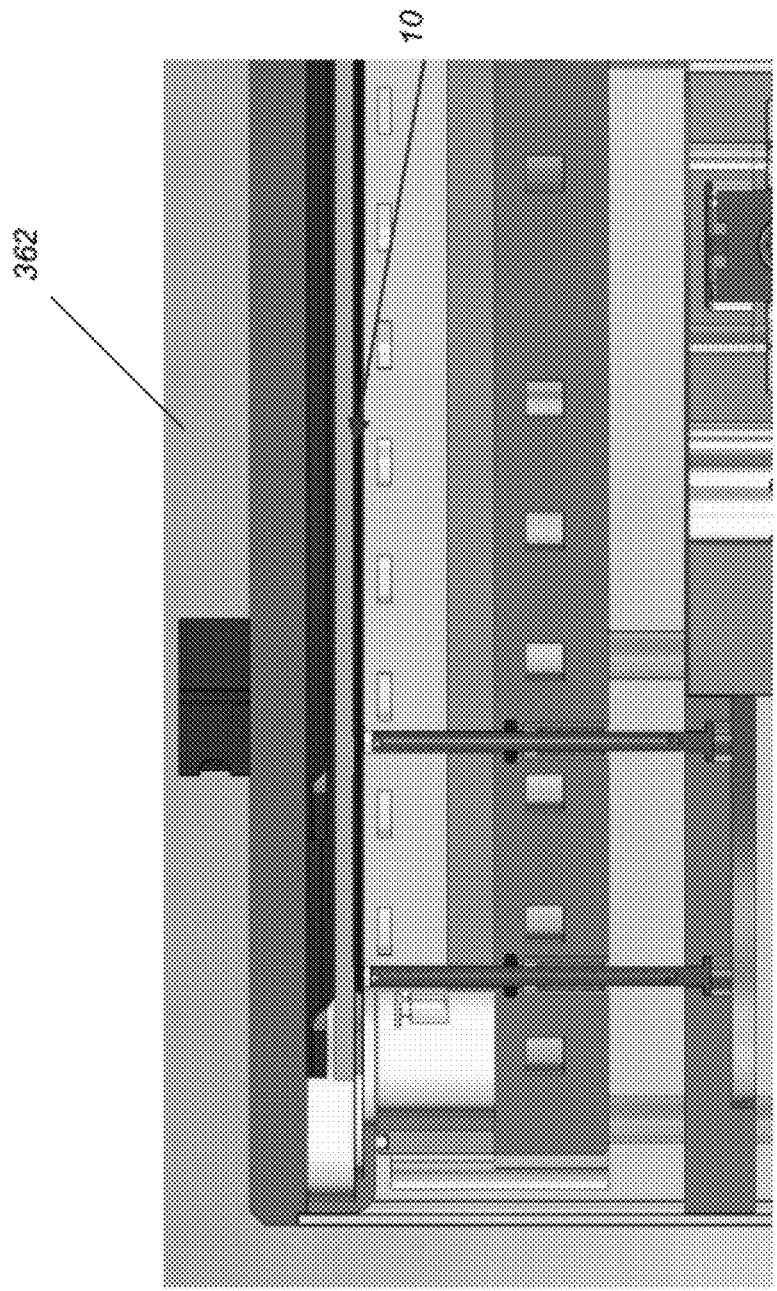

Referring to FIG. 20A, FIG. 20B, FIG. 20C, the temporary bonding operation with the bonder module 210 includes the following steps. First, the non-adhesive substrate is loaded onto the transfer pins 240a by a robot end effector (350). In this case the substrate is a 300 mm wafer and is supported by the 300 mm pins 240a, whereas the 200 mm pins 240b are shown to be slightly lower than the 300 mm pins 240a. Next, the mechanical taper jaws 461a, 461b, move into position around the wafer and the transfer pins 240a move down (352). The transfer pins have vacuum and purge functions. The purge function allows the wafer to float during the centering cycle and the vacuum function holds the wafer when the centering is complete. The tapered "funnel" jaws 461a, 461b, 461c, drive the wafer to the center as it is lowered via the transfer pins 240a. Jaws 461a, 461b, 461c, are designed to accommodate and pre-align any size wafers, including 200 mm and 300 mm, shown in FIGS. 19 and 18, respectively. Next, the centering jaws 461a, 461b, 461c retract and the transfer pins move up to place the top substrate 20 on the upper vacuum chuck 222, as shown in FIG. 20C (354). Next, a second adhesive coated substrate 30 is loaded face up onto the transfer pins 240a by the robot end effector (356), shown in FIG. 21A (356). Next, the mechanical taper jaws 460 move into position around the wafer 30 and the transfer pins 240a move down and then up (358), shown in FIG. 21B. The centering jaws 461a, 461b retract and the transfer pins 240a move down to place the substrate 30 on the bottom vacuum chuck 232 (359), shown in FIG. 21C. Next, the lower heater stage 230 moves up to form a close process gap between the top 20 and bottom 30 substrates and the curtain seal 235 is closed to form the temporary bonding chamber 202 (360), shown in FIG. 22A. An initial deep vacuum is drawn (10-4 mbar) in the temporary bonding chamber 202 while the top substrate with 20 is held via mechanical fingers. Once the set vacuum level is reached the chamber pressure is raised slightly to about 5 mbar to generate a differential vacuum pressure that holds the top substrate 20 to the upper chuck 222. The Z-axis stage 239 moves further up to bring the bottom substrate 30 in contact with the top substrate 20, a shown in FIG. 22B (362). The top chuck 222 is lifted off from the stops 216 by this motion (362). Next, force is applied via the top membrane 224a and bottom top chuck 232 and the wafer stack 10 is heated to the process temperature (364). In one example, the applied force is in the range between 500 N to 8000N and the process temperature is 200 C. In cases where single sided heating is used, the wafer stack 10 is compressed with the membrane pressure to ensure good thermal transfer. After the end of the treatment, the bonded wafer stack 10 is cooled and unloaded with the help of the transfer pins and the robot end effector (366).

In the above described case, the Z-axis moves up to contact the thin, semi-compliant upper chuck 222/membrane 224 design. In this embodiment, the adhesive layer controls the TTV/tilt by applying pressure only in the direction perpendicular to the bond interface via the membranes/chuck flexures and by using a semi compliant chuck to conform to the adhesive topography. In other embodiments, the Z-axis moves up to contact a non-compliant chuck. In these cases the Z-axis motion controls the final thickness of the adhesive layer and forces the adhesive to conform to the rigid flat chuck 222. The adhesive layer thickness may be controlled by using a Z-axis position control, pre-measured substrate thicknesses and known adhesive thicknesses. In yet other embodiments, a compliant layer is installed on the bottom chuck 232 and the adhesive is pre-cured or its viscosity is adjusted. In yet other embodiments, heat is applied both through the bottom and top chucks.

Figure 23:
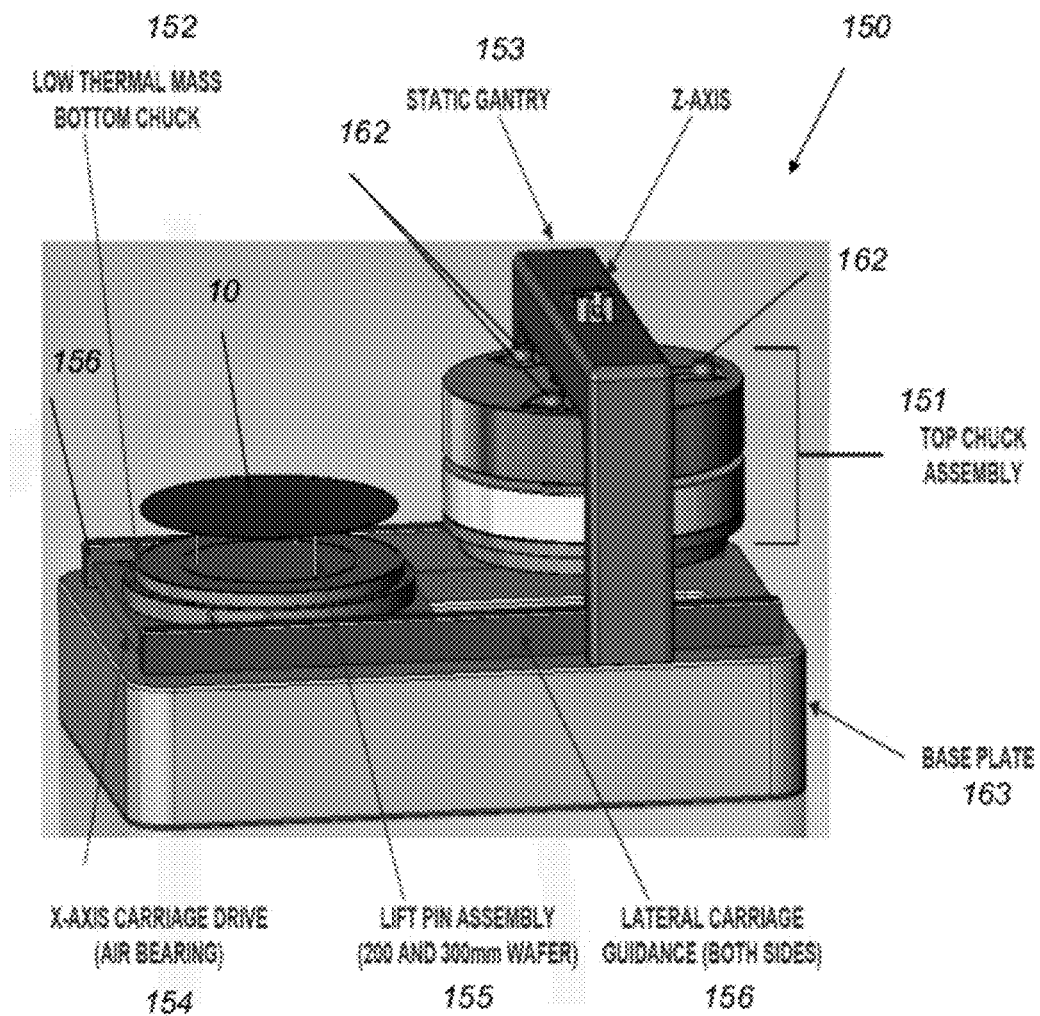
FIG. 23 depicts an overview diagram of the thermal slide debonder A of FIG. 1.

Referring to FIG. 23, thermal slide debonder 150 includes a top chuck assembly 151, a bottom chuck assembly 152, a static gantry 153 supporting the top chuck assembly 151, an X-axis carriage drive 154 supporting the bottom chuck assembly 152, a lift pin assembly 155 designed to raise and lower wafers of various diameters including diameters of 200 mm and 300 mm, and a base plate 163 supporting the X-axis carriage drive 154 and gantry 153.

Figure 24:
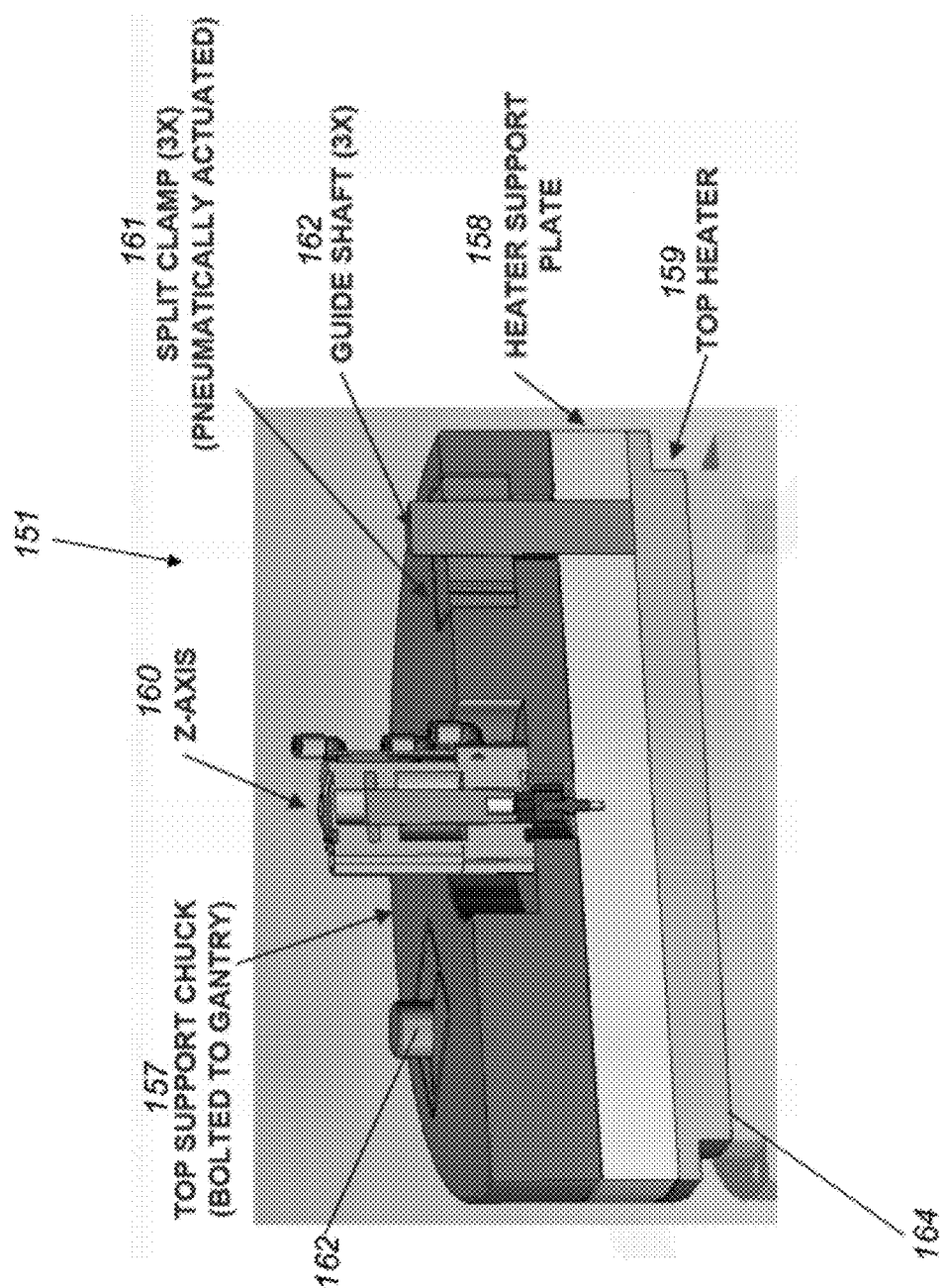
FIG. 24 depicts a cross-sectional view of the top chuck assembly of the debonder A of FIG. 23.

Referring to FIG. 24, the top chuck assembly 151 includes a top support chuck 157 bolted to gantry 153, a heater support plate 158 in contact with the bottom surface of the top support chuck 157, a top heater 159 in contact with the bottom surface of the heater plate 158, a Z-axis drive 160 and a plate leveling system for leveling the upper wafer plate/heater bottom surface 164. The plate leveling system includes three guide shafts 162 that connect the top heater 159 to the top support chuck 157 and three pneumatically actuated split clamps 161. The plate leveling system provides a spherical Wedge Error Compensating (WEC) mechanism that rotates and/or tilts the upper wafer plate 164 around a center point corresponding to the center of the supported wafer without translation. The heater 159 is a steady state heater capable to heat the supported wafer stack 10 up to 350° C. Heater 159 includes a first heating zone configured to heat a 200 mm wafer or the center region of a 300 mm wafer and a second heating zone configured to heat the periphery of the 300 mm wafer. The first and second heating zones are controlled independently from each other in order to achieve thermal uniformity throughout the entire bond interface of the wafer stack and to mitigate thermal losses at the edges of the wafer stack. The heater support plate 158 is water cooled in order to provide thermal isolation and to prevent the propagation of any thermal expansion stresses that may be generated by the top heater 159.

Figure 25:
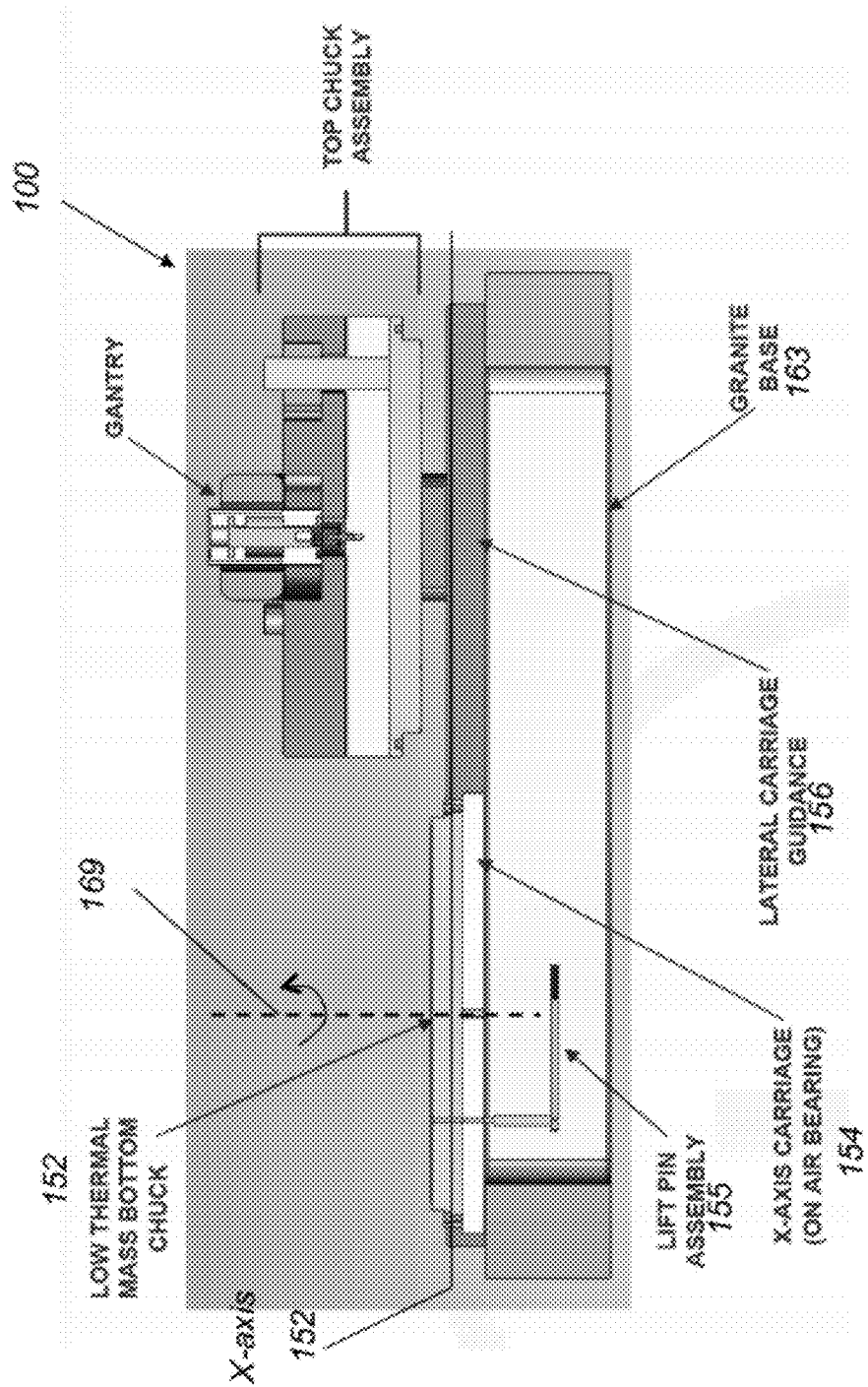
FIG. 25 depicts a cross-sectional side view of the debonder A of FIG. 23.

Referring to FIG. 25, the bottom chuck 152 is made of a low thermal mass ceramic material and is designed to slide along the X-axis on top of the air bearing carriage drive 154. The carriage drive 154 is guided in this X-axis motion by two parallel lateral carriage guidance tracks 156. Bottom chuck 152 is also designed to rotate along its Z-axis 169. A Z-axis rotation by a small angle (i.e., twisting) is used to initiate the separation of the wafers, as will be described below. The base plate 163 is vibration isolated. In one example, base plate is made of granite. In other examples base plate 156 has a honeycomb structure and is supported by pneumatic vibration isolators (not shown).

Figure 26A:
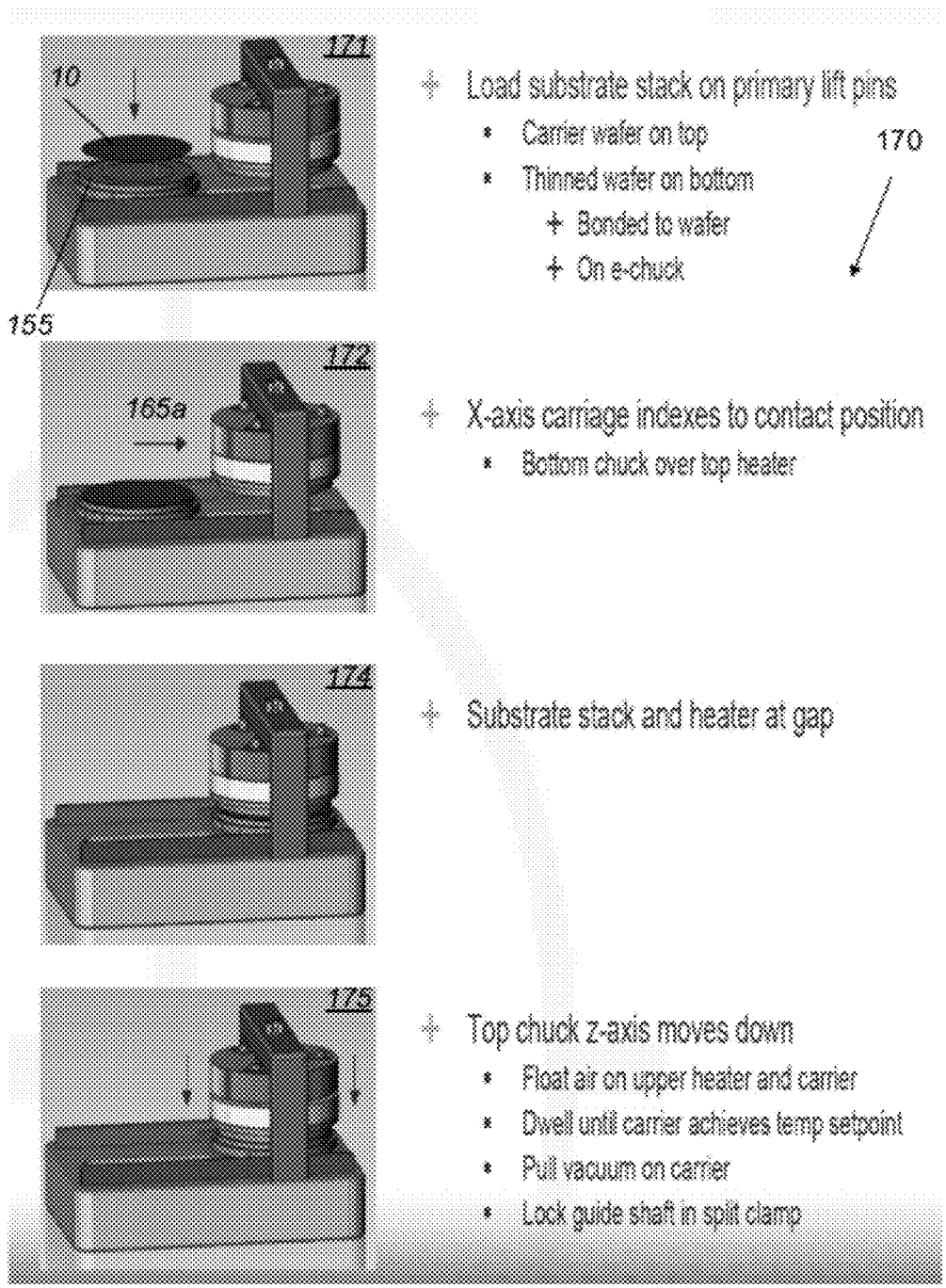
FIG. 26A, FIG. 26B and FIG. 26C depict the thermal slide debonder A operational steps.
Figure 26B:
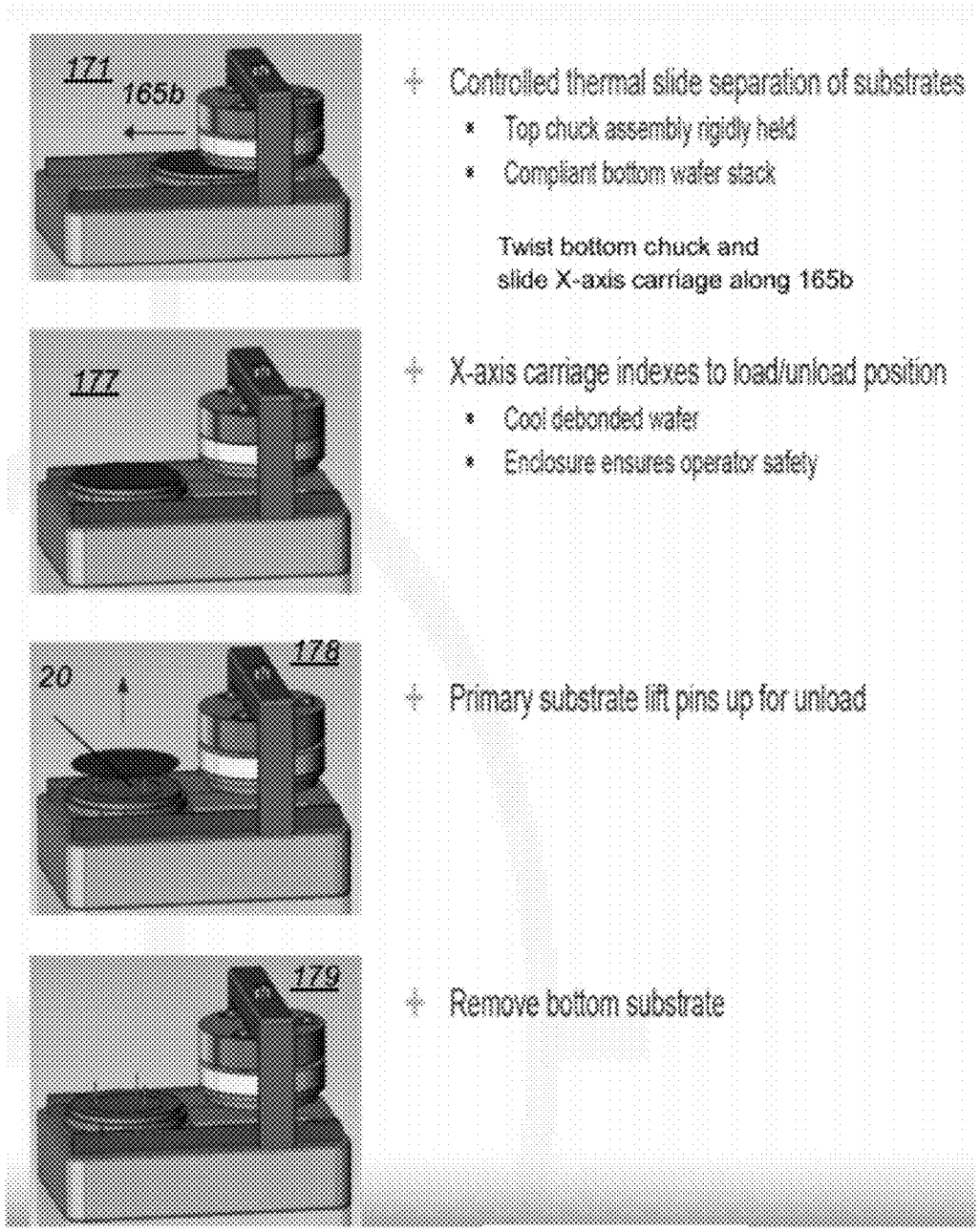
Figure 26C:
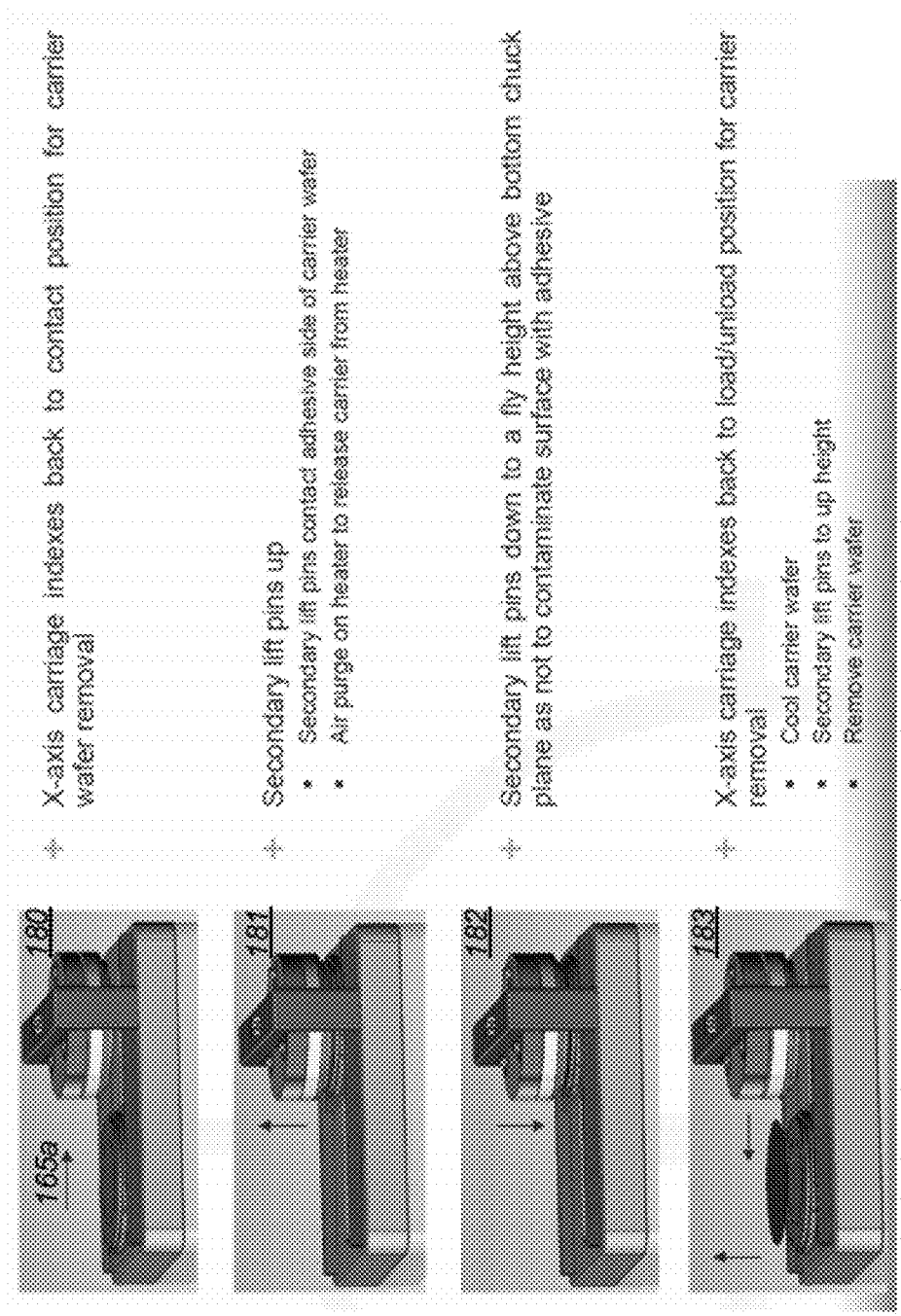

Referring to FIG. 26A, FIG. 26B, FIG. 26C, the debonding operation with the thermal slide debonder 150 of FIG. 23 includes the following steps. First, the temporary bonded wafer stack 10 is loaded on the primary lift pins 155 arranged so that the carrier wafer 30 is on the top and the thinned device wafer 20 is on the bottom (171). Next, the wafer stack 10 is lowered so that the bottom surface of the thinned device wafer 20 is brought into contact with the bottom chuck 152 (172). The bottom chuck 152 is then moved along the 165a direction until it is under the top heater 159 (174). Next, the Z-axis 160 of the top chuck 151 moves down and the bottom surface 164 of the top heater 159 is brought into contact with the top surface of the carrier wafer 30 and then air is floated on top heater 159 and carrier wafer 30 until the carrier wafer stack 30 reaches a set temperature. When the set temperature is reached, vacuum is pulled on the carrier wafer 30 so that is held by the top chuck assembly 151 and the guide shafts 162 are locked in the split clamps 162 (175). At this point the top chuck 151 is rigidly held while the bottom chuck 152 is compliant and the thermal slide separation is initiated (176) by first twisting the bottom chuck 152 and then moving the X-axis carriage 154 toward the 165b direction away from the rigidly held top chuck assembly 151 (177). The debonded thinned device wafer 20 is carried by the X-axis carriage 154 to the unload position where it is lifted up by the pins (178) for removal (179). Next, the X-axis carriage 154 moves back along direction 165a (180). Upon reaching the position under the top chuck assembly 151, the lift pins 155 are raised to contact the adhesive side of the carrier wafer 30 and air is purged onto the heater plate 159 to release the carrier wafer from it (181). The lift pins 155 are lowered to a height just above the bottom chuck plane so as to not contaminated the bottom chuck top surface with the adhesive (182) and the X-axis carriage 154 moves along 165b back to the unload position. The carrier wafer is cooled and then removed (183).

Figure 27:
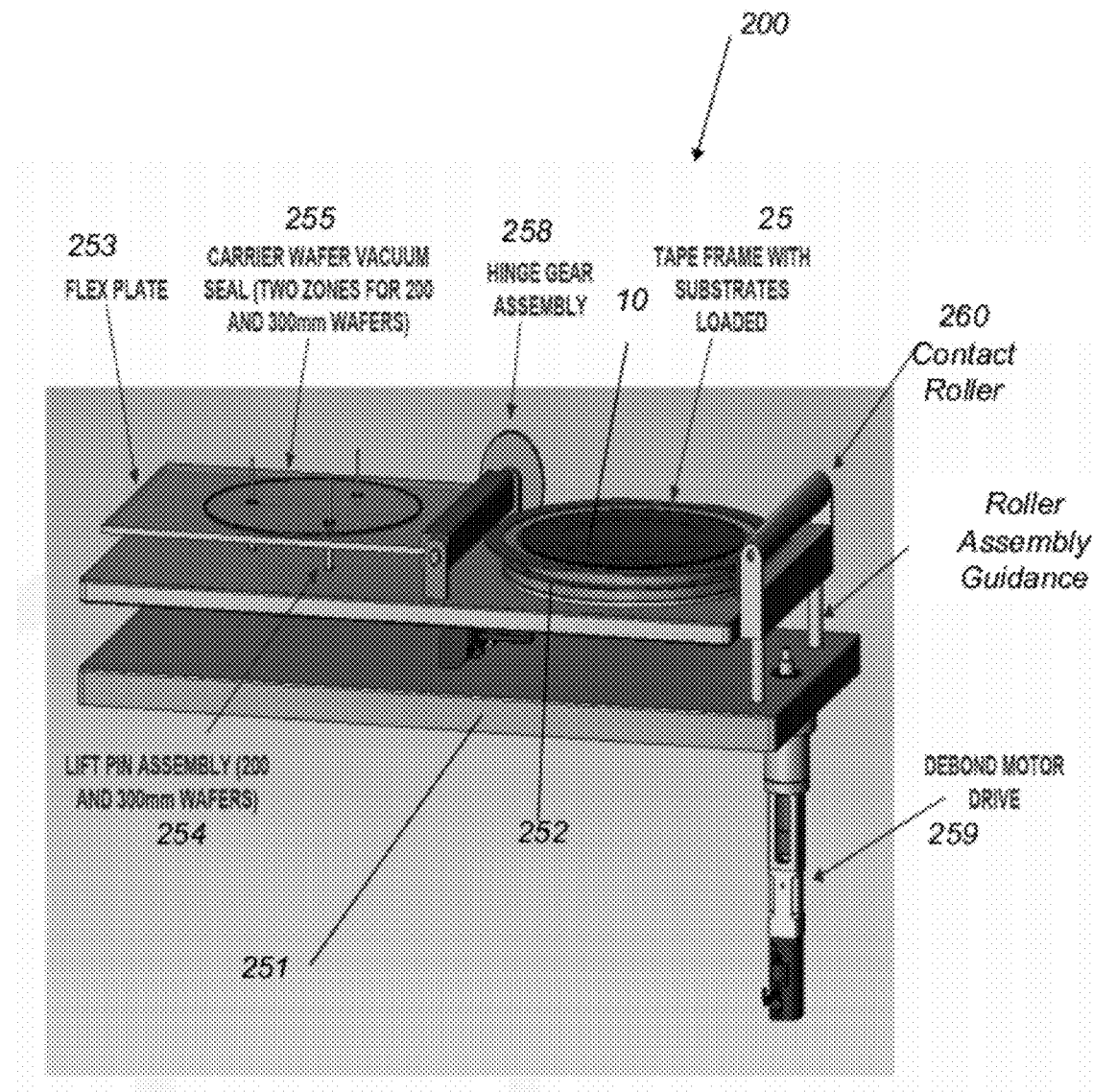
FIG. 27 depicts an overview diagram of the mechanical debonder B of FIG. 1.
Figure 28:
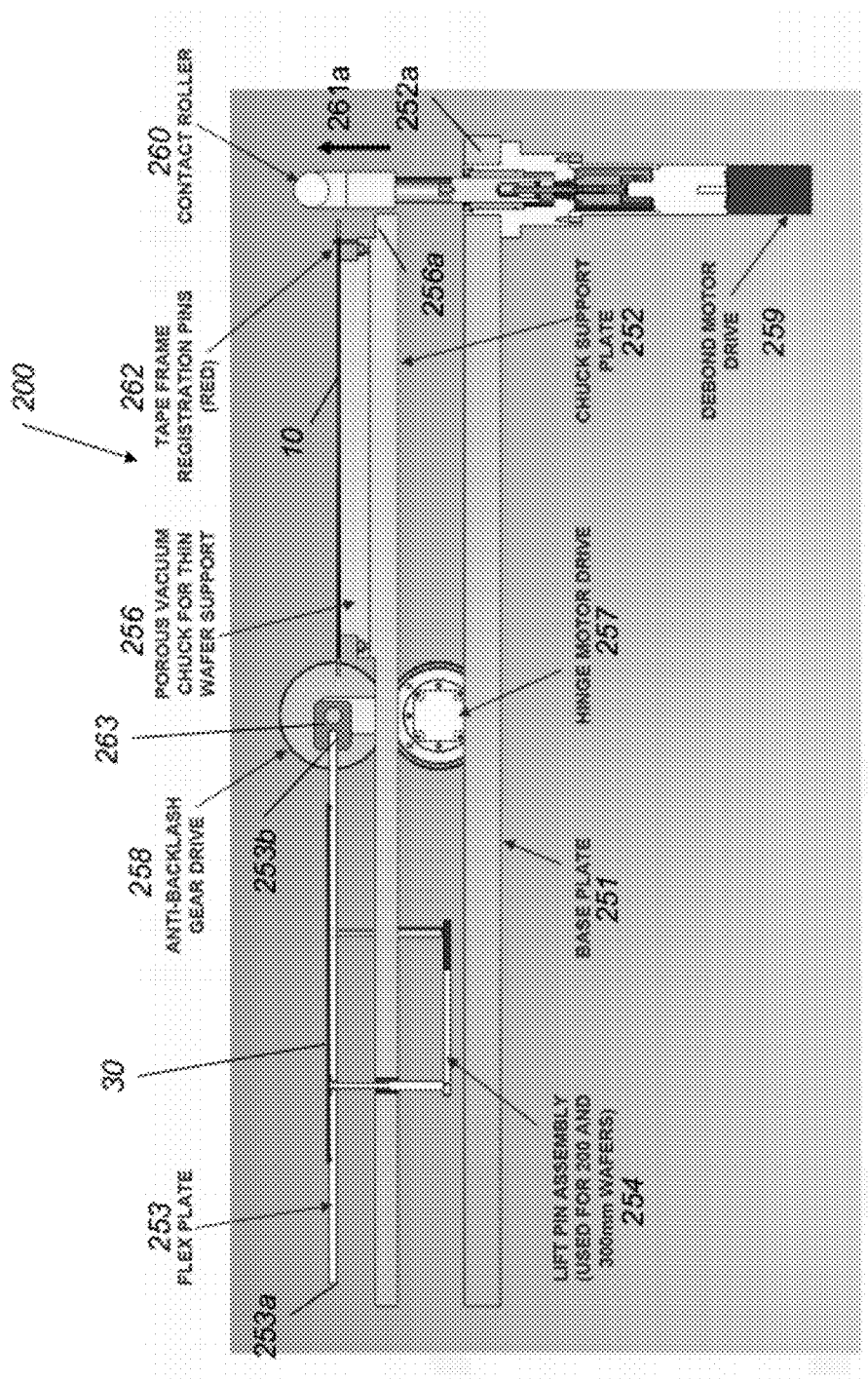
FIG. 28 depicts a cross-sectional side view of the debonder B of FIG. 27.

Referring to FIG. 2A, mechanical debonder B 250 debonds the carrier wafer 30 from the thinned device wafer 20 by mechanically lifting an edge 31 of the carrier wafer 30 away from the thinned device wafer 20. Prior to the debonding process the temporary bonded wafer stack 10 is attached to a frame 25, and upon separation the thinned wafer remains supported by the frame 25. Referring to FIG. 27 and FIG. 28, debonder 250 includes a flex plate 253 with a two zone circular vacuum seal 255. Seal 255 includes two zones, one for a sealing a 200 mm wafer placed within the area surrounded by the seal and a second for sealing a 300 mm wafer within the area surrounded by the seal. Seal 255 is implemented either with an O-ring or with suction cups. A lift pin assembly 254 is used to raise or lower the separated carrier wafer 30 that is transported by the flex plate 253. Debonder 250 also includes a vacuum chuck 256. Both the vacuum chuck 256 and the flex plate 253 are arranged next to each other upon a support plate 252, which in turn is supported by the base plate 251. Flex plate 253 has an edge 253b connected to a hinge 263 that is driven by a hinge motor drive 257. Vacuum chuck 256 is made of a porous sintered ceramic material and is designed to support the separated thin wafer 20. Hinge motor drive 257 is used to drive the flex plate 253 upon the wafer stack 10 after the wafer stack 10 has been loaded on the vacuum chuck 256. An anti-backlash gear drive 258 is used to prevent accidental backing of the flex plate 253. A debond drive motor 259 is attached at the edge 251a of the base plate 251 and next to the edge of the chuck support plate 252a. Debond drive motor 259 moves a contact roller 260 vertical to the plane of the base plate 251 in direction 261 and this motion of the contact roller 260 lifts the edge 253a of the flex plate 253 after the flex plate has been placed upon the loaded wafer stack 10, as will be described below.

Figure 29:
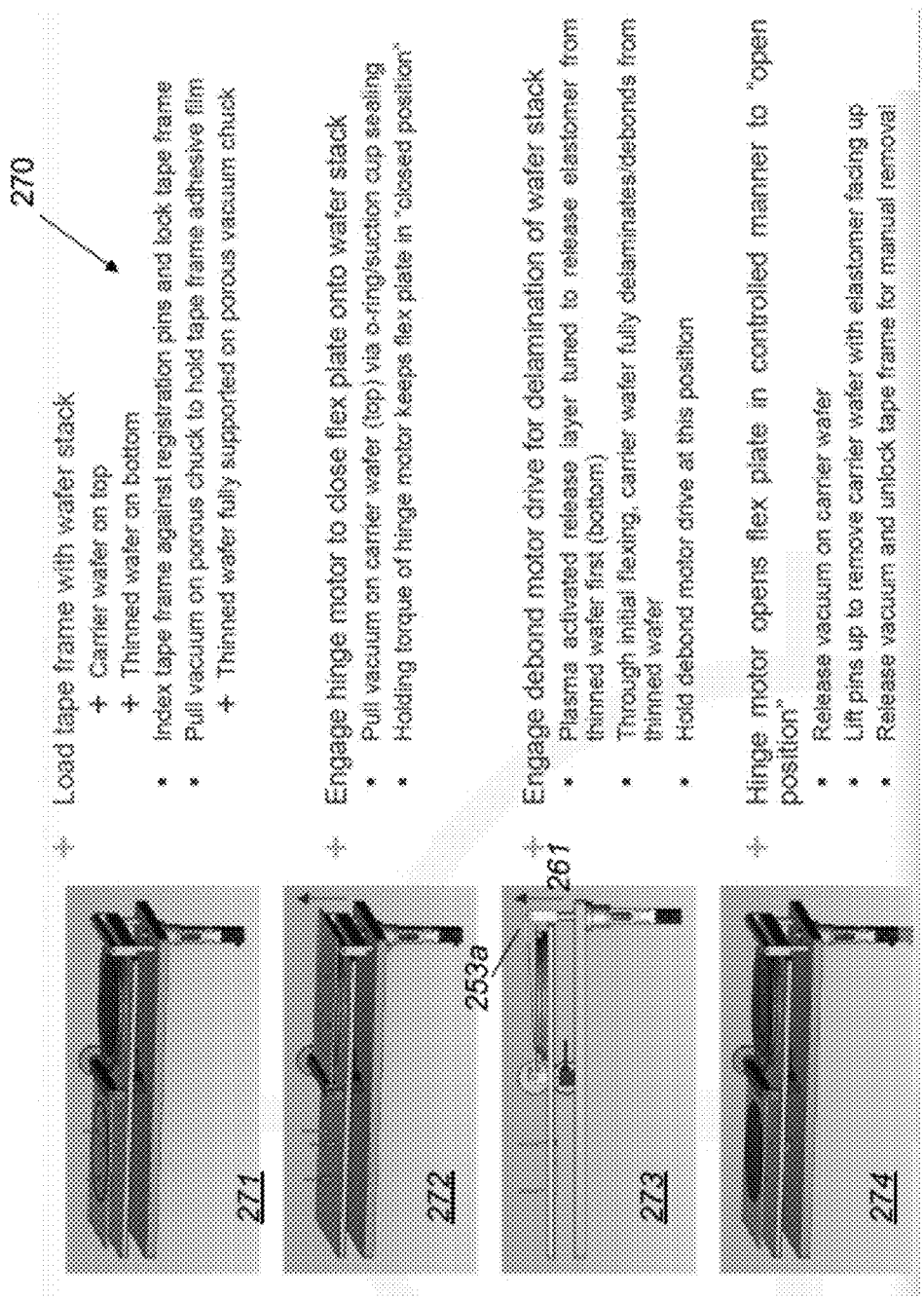
FIG. 29 depicts the debonder B operational steps.

Referring to FIG. 29, the debonding operation 270 with the debonder 250 includes the following steps. First, The tape frame 25 with the wafer stack 10 is loaded upon the vacuum chuck 256, so that the carrier wafer 30 is on the top and the thinned wafer 20 is on the bottom (271). The tape frame 25 is indexed against the frame registration pins 262, shown in FIG. 28, and the position of the tape frame 25 is locked. Next, vacuum is pulled through the porous vacuum chuck 256 to hold the tape frame adhesive film. Next, the hinge motor 257 is engaged to transport the flex plate 253 onto the loaded wafer stack, so that it is in contact with the back of the carrier wafer 30 (272). Upon reaching the position upon the carrier wafer 30, vacuum is pulled on the carrier wafer top via the seal 255. The torque of the hinge motor 257 is kept constant to maintain the flex plate 253 in this "closed position". Next, the debond motor 259 is engaged to move the contact roller 260 up in the direction 261a and to push the edge 253a of the flex plate 253 up (273). This upward motion of the flex plate edge 253a bents (or flexes) slightly the carrier wafer 30 and cause the wafer stack 10 to delaminate along the release layer 32 and thereby to separate the carrier wafer 30 from the thinned wafer 20. Silicon wafers break or cleave much easier along the (110) crystallographic plane than any other orientation. Therefore, the carrier wafer 30 is fabricated on a (110) plane so that its 110 direction is perpendicular to the push direction 261a, thereby preventing breaking of the wafer 30 during delamination. The thinned wafer 20 remains attached to the tape frame 25, which is held by the vacuum chuck 256. Through this step the debond motor 259 is held constant in position. Next, the hinge motor drive 257 opens the flex plate 253 with the attached separated carrier wafer 30 in the "open position", in a controlled manner (274). The flex plate vacuum is released thereby releasing the carrier wafer 30. Next, the lift pins 254 are moved up to raise the carrier wafer 30 oriented so that the release layer 32 is facing up and then the carrier wafer 30 is removed. Next, the vacuum through the porous vacuum chuck 256 is released and the tape 25 with the attached thinned wafer 20 is removed.

Several embodiments of the present invention have been described. Nevertheless, it will be understood that various modifications may be made without departing from the spirit and scope of the invention. Accordingly, other embodiments are within the scope of the following claims.

What is claimed is:

1. A debonder apparatus for debonding two via an adhesive layer combined with a release layer temporary bonded wafers, comprising:
    a chuck assembly comprising a chuck and a first wafer holder configured to hold wafers in contact with the top surface of the chuck;
    a flex plate assembly comprising a flex plate and a second wafer holder configured to hold wafers in contact with a first surface of the flex plate, wherein said flex plate comprises a first edge connected to a hinge and a second edge diametrically opposite to the first edge, and wherein said flex plate's first edge is arranged adjacent to a first edge of the chuck and said flex plate is configured to swing around said hinge and to be placed above the top surface of the chuck;
    a contact roller arranged adjacent to a second edge of the chuck, said second edge of the chuck being diametrically opposite to its first edge;
    a debond drive motor configured to move the contact roller vertical to the plane of the chuck top surface;
    wherein a wafer pair, comprising a carrier wafer stacked upon and being bonded to a device wafer via an adhesive layer and a release layer, is placed upon said chuck so that the unbonded surface of the device wafer is in contact with the chuck top surface;
    wherein said flex plate swings around said hinge and is placed above said bottom chuck so that its first surface is in contact with the unbonded surface of the carrier wafer;
    wherein said contact roller is driven upward until it contacts and pushes the second edge of the flex plate up while said carrier wafer is held by said flex plate and said device wafer is held by said chuck via said second and first wafer holders, respectively; and
    wherein said contact roller push flexes said second edge of the flex plate and causes delamination of the wafer pair along the release layer.

2. The debonder of claim 1 further comprising a hinge motor and wherein said hinge is driven by said hinge motor.

3. The debonder of claim 1 wherein said first and second holders comprise vacuum pulling through the chuck and the flex plate, respectively.

4. The debonder of claim 1 wherein said wafer pair further comprises a tape frame and said device wafer is held by said chuck by holding said tape frame via the vacuum pulled through the chuck.

5. The debonder of claim 1 further comprising a support plate supporting said chuck assembly, said flex plate assembly and said hinge.

6. The debonder of claim 5 further comprising a base plate supporting said support plate, said contact roller, said hinge motor and said debond drive motor.

7. The debonder of claim 1 wherein said flex plate assembly further comprises a lift pin assembly designed to raise and lower wafers placed on the first surface of the flex plate.

8. The debonder of claim 1 wherein said flex plate further comprises two independently controlled concentric vacuum zones configured to hold wafers having a diameter of 200 or 300 millimeters, respectively.

9. The debonder of claim 8 wherein said vacuum zones are sealed via one of an O-ring or suction cups.

10. The debonder of claim 1 wherein said chuck comprises a vacuum chuck made of porous ceramic materials.

11. The debonder of claim 1 further comprising an anti-backlash gear drive configured to prevent accidental back swing of the flex pate.

* * * * *